US007333034B2

(12) United States Patent
Matsumoto et al.

(10) Patent No.: US 7,333,034 B2
(45) Date of Patent: Feb. 19, 2008

(54) DATA PROCESSING DEVICE, ENCODING DEVICE, ENCODING METHOD, DECODING DEVICE DECODING METHOD, AND PROGRAM

(75) Inventors: Jun Matsumoto, Kanagawa (JP); Masayuki Nishiguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 72 days.

(21) Appl. No.: 10/557,557

(22) PCT Filed: May 20, 2004

(86) PCT No.: PCT/JP2004/007236

§ 371 (c)(1), (2), (4) Date: Nov. 21, 2005

(87) PCT Pub. No.: WO2004/105253

PCT Pub. Date: Dec. 2, 2004

(65) Prior Publication Data

US 2007/0025446 A1 Feb. 1, 2007

(30) Foreign Application Priority Data

May 21, 2003 (JP) ............................ 2003-142975

(51) Int. Cl.
*H03M 7/00* (2006.01)

(52) U.S. Cl. ......................... 341/61; 708/300; 708/313

(58) Field of Classification Search .................. 341/61; 708/300, 313
See application file for complete search history.

(56) References Cited

U.S. PATENT DOCUMENTS 5,461,604 A * 10/1995 Hasegawa .............. 369/124.05
6,115,685 A 9/2000 Inoue et al.
6,311,158 B1 * 10/2001 Laroche ...................... 704/269

(Continued)

FOREIGN PATENT DOCUMENTS

AU 2112700 7/2000

(Continued)

OTHER PUBLICATIONS

Eric Allamanche et al., "MPEG-4 Low Delay Audio Coding based on the AAC Codec," 106th Convention, An Audio Engineering Society Preprint, Germany, May 8-11, 1999.—pp. 1-21.

*Primary Examiner*—Khai M. Nguyen
(74) *Attorney, Agent, or Firm*—Finnegan, Henderson, Farabow, Garrett & Dunner, L.L.P.

(57) ABSTRACT

The present invention relates to a data processing apparatus, a method and apparatus for encoding, a method and apparatus for decoding, and a program, that allow a reduction in an algorithm delay. An interpolator 51 produces interpolated PCM data by performing R-times oversampling on original PCM data. A frame encoder 54 fetches a predetermined number of samples of the oversampled data as one frame, encodes the oversampled data on a frame-by-frame basis, and outputs resultant encoded data. A frame decoder 55 decodes the encoded data on a frame-by-frame basis at a rate R times higher than a predetermined normal rate. A decimator 56 decimates data obtained as a result of the decoding such that the number of samples is reduced to 1/R of the number of sampled included in the original data. The present invention is applicable, for example, to an IP telephone system.

13 Claims, 22 Drawing Sheets

U.S. PATENT DOCUMENTS

| | | | | |
|---|---|---|---|---|
| 6,587,817 | B1 | 7/2003 | Vähätalo et al. | |
| 6,754,273 | B1 * | 6/2004 | Sackstein et al. ...... | 375/240.21 |

FOREIGN PATENT DOCUMENTS

| | | |
|---|---|---|
| CN | 1132155 | 2/2002 |
| EP | 1145221 | 10/2001 |
| FI | 990033 | 7/2000 |
| JP | 1129198 | 8/1999 |
| WO | WO 00/41163 | 7/2000 |

* cited by examiner

DATA PROCESSING DEVICE, ENCODING DEVICE, ENCODING METHOD, DECODING DEVICE DECODING METHOD, AND PROGRAM

TECHNICAL FIELD

The present invention relates to a data processing apparatus, a method and apparatus for encoding, a method and apparatus for decoding, and a program. More particularly, the present invention relates to a data processing apparatus, a method and apparatus for encoding, a method and apparatus for decoding, and a program, that allow a reduction in a so-called algorithm delay.

BACKGROUND ART

FIG. 1 shows a conventional communication system.

In FIG. 1, the communication system includes a transmitter 1 and a receiver 2. For example, digital audio data (including voice data) in the form of PCM (Pulse Code Modulation) data is supplied to the transmitter 1. The transmitter 1 encodes the supplied PCM data and transmits resultant encoded data to the receiver 2 via a wired or wireless transmission line 3. The receiver 2 decodes the encoded data transmitted from the transmitter 1 into PCM data.

The transmitter 1 includes a signal storage unit 11 and a frame encoder 12. PCM data supplied to the transmitter 1 is temporarily stored in the signal storage unit 11. The frame encoder 12 sequentially reads PCM data frame by frame from the signal storage unit 11. Herein, one frame of PCM data includes a predetermined number N of samples. The frame encoder 12 performs quantization and encoding on the read PCM data and transmits the resultant encoded data via the transmission line 3.

The receiver 2 includes a frame decoder 13. The frame decoder 13 receives the encoded data transmitted from the transmitter 1 and performs inverse quantization and decoding on the received data. The resultant data decoded into PCM data is output.

One known method of encoding/decoding PCM data on a frame-by-frame basis is that according to the MPEG (Moving Picture Experts Groups) standard (the details of which are described, for example, in "MPEG-4 Low Delay Audio Coding based on the AAC Codec", Presented by Eric Allamanche, Ralf Geiger, Juergen Herre and Thomas Sporer, at the 106th Convention, May 8-11, 1999, Munich and Germany (An Audio Engineering Society Preprint)).

One known method to increase the encoding efficiency of the PCM data in the encoding process performed by the transmitter 1 is to increase the number of samples included in one frame of PCM data (hereinafter, also referred to as the frame length).

However, the increase in the frame length causes the frame encoder 12 to have a delay in starting the process, because the frame encoder 12 cannot start the process until the PCM data with the frame length is completely supplied and stored in the signal storage unit 11. That is, when the frame length is N (samples) and the sampling frequency of PCM data is Fs (Hz), the frame encoder 12 cannot start processing for a period of N/Fs (seconds) after supplying of PCM data to the signal storage unit 11 is started. The delay in starting of the process performed by the frame encoder 12 due to the necessity of waiting until all PDM data with the frame length is completely obtained is called an algorithm delay (principle delay).

Therefore, when the communication system shown in FIG. 1 is applied to an IP (Internet Protocol) telephone system (also called an Internet telephone system), a user of the receiver 2 cannot receive data of a voice uttered by a user of the transmitter 1 at least for a period of N/Fs (seconds) after the user of the transmitter 1 starts the utterance.

More specifically, for example, when the sampling rate of the PCM data is 48000 (Hz), and each frame includes 2048 samples, the algorithm delay is equal to 43 (milliseconds) (=2048/48000).

In addition to the algorithm delay, other delays can occur between the transmitter 1 and the receiver 2 in the system. Examples of such delays include a delay due to an encoding process and a delay that occurs in transmission over the transmission line 3. Therefore, if as large an algorithm delay as about 43 (m sec) occurs, the total delay becomes very large. Such a large total delay can make it difficult to allow smooth communication between users in an IP telephone system or the like in which a real-time two-way communication is needed.

The algorithm delay can be reduced by reducing the length of each frame that is processed at a time by the frame encoder 12 or the frame decoder 13.

However, to realize the frame encoder 12 and the frame decoder 13 at low cost, it is desirable that the frame encoder 12 and the frame decoder 13 be realized using a conventional codec (Compression/Decompression) system.

In the conventional codec system, the change in the frame length that is processed at a time needs a great and difficult modification.

DISCLOSURE OF INVENTION

In view of the above, the present invention provides a technique of reducing the algorithm delay without changing the frame length.

The present invention provides data processing apparatus including oversampling means that, when the oversampling means acquires N/R samples of data, performs R-times oversampling on the acquired N/R samples of data thereby producing N samples of data, encoding means for performing encoding on the data on a frame-by-frame basis and outputting resultant encoded data, encoding control means that controls the encoding means so as to perform the encoding process at a rate R times higher than a rate at which the encoding process is performed if the encoding is performed after waiting for acquiring N samples of data without performing oversampling, decoding means for decoding the encoded data, and decimation means that decimates data output by the decoding means and outputs resultant data including samples the number of which is 1/R time the number of samples included in the original output data.

The present invention provides an encoder including oversampling means that performs R-times oversampling on a series of data, encoding means that encodes the oversampled data on a frame-by-frame basis and outputs resultant encoded data, each frame of oversampled data including a predetermined number N of samples, and encoding control means that controls the encoding means so as to perform the encoding process at a rate R times higher than a rate at which the encoding process is performed if the encoding is performed after waiting for acquiring N samples of data without performing oversampling.

The present invention provide an encoding method including the steps of performing R-times oversampling on a series of data, encoding the oversampled data on a frame-by-frame basis and outputting resultant encoded data, each frame of oversampled data including a predetermined number N of samples, and controlling the encoding step so as to perform the encoding process at a rate R times higher than a rate at which the encoding process is performed if the encoding is performed after waiting for acquiring N samples of data without performing oversampling.

The present invention provides a first program including the steps of performing R-times oversampling on a, series of data, encoding the oversampled data on a frame-by-frame basis and outputting resultant encoded data, each frame of oversampled data including a predetermined number N of samples, and controlling the encoding step so as to perform the encoding process at a rate R times higher than a rate at which the encoding process is performed if the encoding is performed after waiting for acquiring N samples of data without performing oversampling.

The present invention provides a decoder including decoding means for decoding encoded data, decimation means that decimates output data that is decoded on a frame-by-frame basis and output by the decoding means and outputs resultant data including samples the number of which is 1/R time the number of samples included in the original output data, and decoding control means that controls the decoding means such that the decoding means performs the process at a rate R times higher than the rate at which the process is performed if the decimation is not performed.

The present invention provides a decoding method including the steps of decoding encoded data, decimating output data that is decoded on a frame-by-frame basis and output in the decoding step and outputting resultant data including samples the number of which is 1/R time the number of samples included in the original output data, and controlling the decoding step such that the process is performed at a rate R times higher than the rate at which the process is performed if the decimation is not performed.

The present invention provides a second program including the steps of decoding encoded data, decimating output data that is decoded on a frame-by-frame basis and output in the decoding step and outputting resultant data including samples the number of which is 1/R time the number of samples included in the original output data, and controlling the decoding step such that the process is performed at a rate R times higher than the rate at which the process is performed if the decimation is not performed.

In data processing apparatus according to the present invention, when N/R samples of data are acquired, R-times oversampling is performed on the acquired N/R samples of data thereby producing N samples of data. Encoding is then performed on the data on a frame-by-frame basis and resultant encoded data is output. The encoding process is controlled such that the encoding process is performed at a rate R times higher than a rate at which the encoding process is performed if the encoding is performed after waiting for acquiring N samples of data without performing oversampling. The encoded data is decoded, and data obtained as a result of the decoding is decimated such that the number of samples is reduced to 1/R of the original number of samples.

In the encoder, the encoding method, and the first program according to the present invention, R-times oversampling is performed on a series of data, a predetermined number N of samples of the oversampled data are fetched as one frame, and the oversampled data is encoded on a frame-by-frame basis. Resultant encoded data is output. The encoding process is performed at a rate R times higher than a rate at which the encoding process is performed if the encoding is performed after waiting for acquiring N samples of data without performing oversampling.

In the decoder, the decoding method, and the second program according to the present invention, the encoded data is decoded, and data obtained as a result of the decoding is decimated such that the number of samples is reduced to 1/R of the original number of samples. In this case, the process is performed at the rate R times higher than the rate at which the process is performed if decimation is not performed.

BEST MODE FOR CARRYING OUT THE INVENTION

Figure 2:
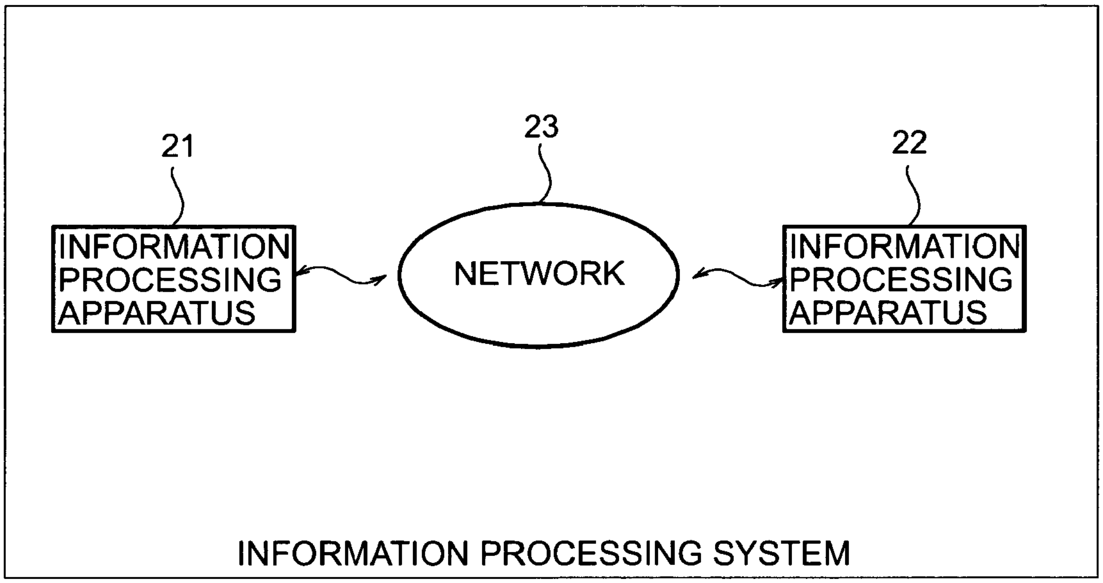
FIG. 2 is a block diagram showing a construction of an information processing system according to an embodiment of the present invention.

FIG. 2 shows a construction of an information processing system according to an embodiment of the present invention.

Information processing apparatus 21 and 22 perform various processes by executing programs. The information processing apparatus 21 and 22 are connected to a network 23 such as the Internet such that the information processing apparatus 21 and 22 are capable of communicating with a server (not shown) or the like on the network 23. The information processing apparatus 21 and 22 are also capable of communicating with each other via the network 23.

As for the information processing apparatus 21 or 22, for example, a general-purpose computer, a mobile telephone, a portable game machine, or an electronic personal organizer such as a PDA (Personal Digital Assistant) device may be used.

Figure 3:
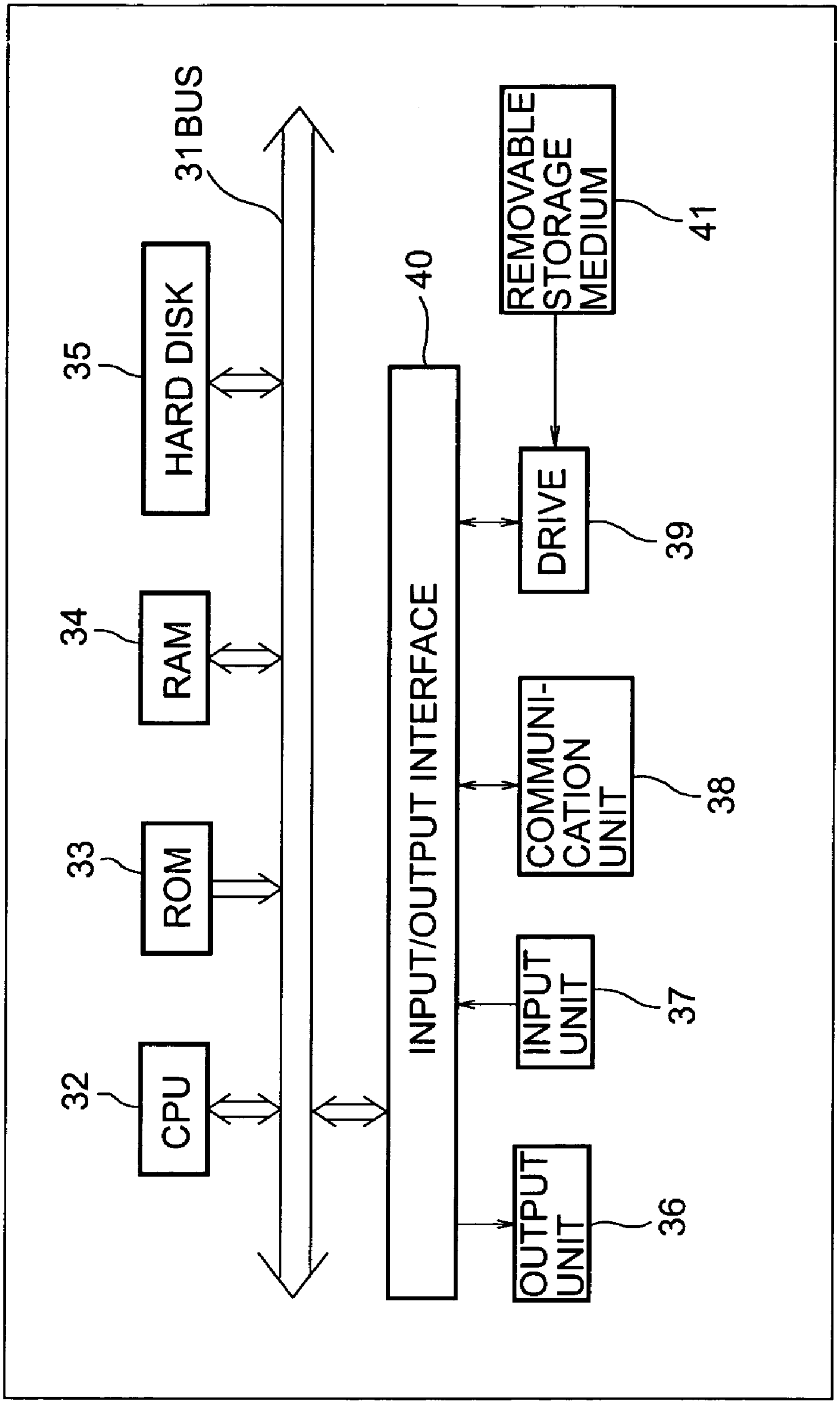
FIG. 3 is a block diagram showing an example of a hardware configuration for implementing an information processing apparatus 21 (22) on a computer.

FIG. 3 shows an example of a hardware configuration for implementing an information processing apparatus 21 or 22 on a general-purpose computer.

The computer serving as the information processing apparatus 21 or 22 includes a CPU (Central Processing Unit) 32. The CPU 32 is connected to an input/output interface 40 via a bus 31. If a user inputs a command by operating an input unit 37 including a keyboard, mouse, and/or a microphone, the command is transferred to the CPU 32 via an input/output interface 40. In accordance with the input command, the CPU 32 executes a program stored in a ROM (Read Only Memory) 32. Alternatively, the CPU 32 may execute a program loaded in a RAM (Random Access Memory) 34 wherein the program may be loaded into the RAM 34 by transferring a program stored on a hard disk 35 into the RAM 34, or transferring a program which has been installed on the hard disk 35 after being received from a satellite or a network via a communication unit 38, or transferring a program which has been installed on the hard disk 35 after being read from a removable storage medium 41 loaded on a drive 39. By executing the program, the CPU 32 performs processes described later with reference to flow charts or block diagrams. The CPU 32 outputs the result of the process, as required, to an output device including an LCD (Liquid Crystal Display) and/or a speaker via an input/output interface 40. The result of the process may also be transmitted via the communication unit 38 or may be stored on the hard disk 35.

The program used by the computer serving as the information processing apparatus 21 or 22 may be stored, in advance, on the hard disk 35 or the ROM 33 serving as a storage medium disposed inside the computer.

Alternatively, the program may be stored (recorded) temporarily or permanently on a removable storage medium 41 such as a floppy disk, a CD-ROM (Compact Disc Read Only Memory), an MO (Magnetooptical) disk, a DVD (Digital Versatile Disc), a magnetic disk, or a semiconductor memory. Such a removable storage medium 41 may be provided in the form of so-called package software.

Instead of installing the program from the removable storage medium 41 onto the computer, the program may also be transferred to the computer from a download site via a digital broadcasting satellite by means of radio transmission or via a network such as an LAN (Local Area Network) or the Internet by means of wire communication. In this case, the computer receives, using a communication unit 38, the program transmitted in the above-described manner and installs the program on the hard disk 35 disposed in the computer.

In the present invention, the processing steps described in the program to be executed by a computer to perform various kinds of processing are not necessarily required to be executed in time sequence according to the order described in the flow chart. Instead, the processing steps may be performed in parallel or separately (by means of parallel processing or object processing).

The program may be executed either by a single computer or by a plurality of computers in a distributed fashion. The program may be transferred to a computer at a remote location and may be executed thereby.

In the following discussion, it is assumed that the information processing apparatus 21 and 22 are each implemented on a computer, and various processes, which will be described later, are performed by each computer using software, although the processes can also be performed using dedicated hardware.

Each of the information processing apparatus 21 and 22 has a codec program installed therein for encoding audio data into encoded data, and for decoding encoded data into audio data. By executing the codec program on the CPU 32, each of the information processing apparatus 21 and 22 can function as a codec system.

Figure 4:
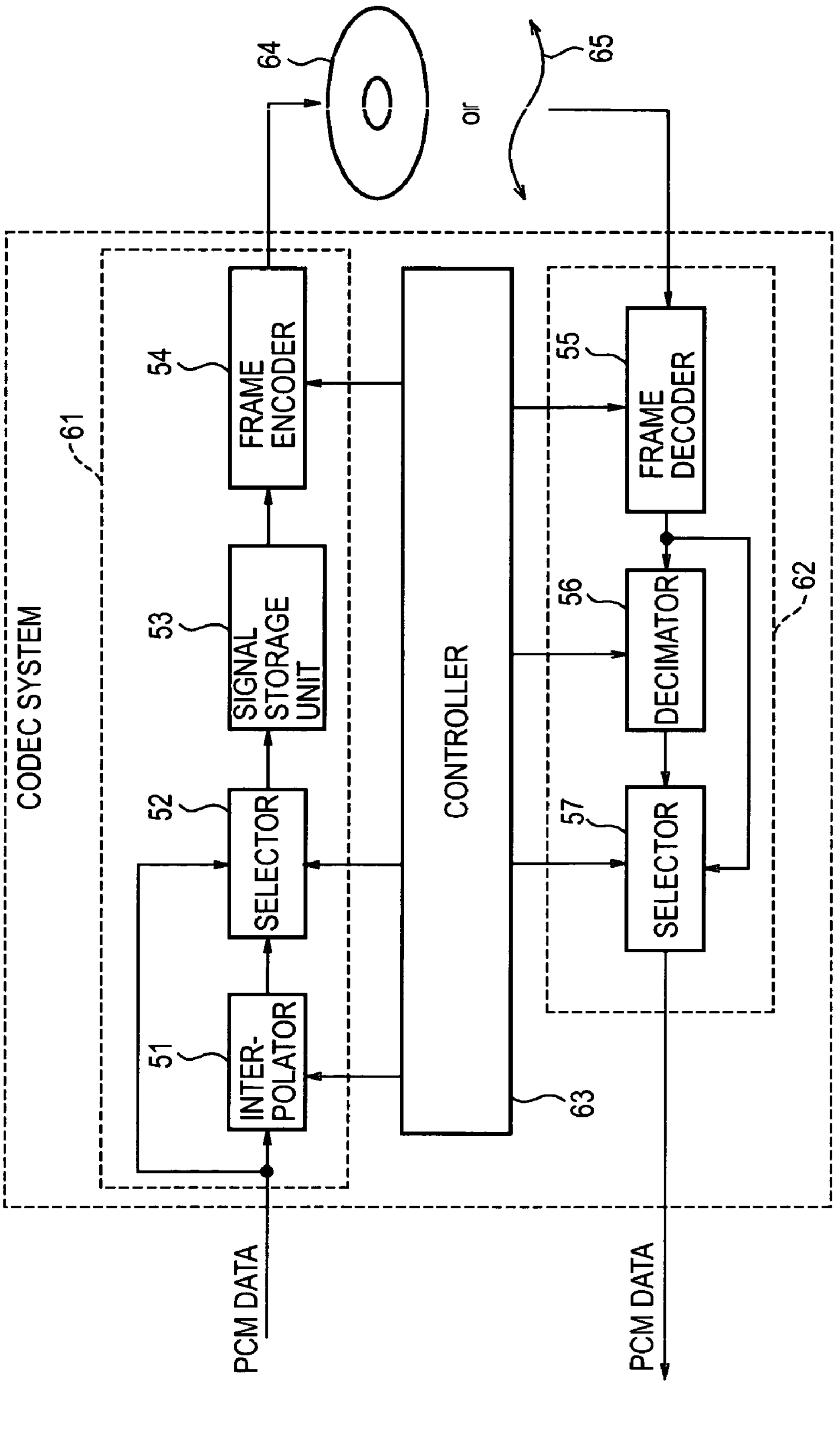
FIG. 4 is a block diagram showing a configuration of a codec system implemented by executing a program on an information processing apparatus 21 (22), according to an embodiment of the present invention.

FIG. 4 shows an example of a functional configuration of a codec system implemented by executing the program on the information processing apparatus 21 or 22.

The codec system includes an encoder 61, a decoder 62, and a controller 63, and is configured to encode audio data into encoded data and decode encoded data into audio data.

In this codec system, if audio data in the form of PCM data is input to the codec system, the audio data is supplied to the encoder 61. The encoder 61 captures PCM data including N samples as one frame of data, and sequentially encodes the PCM data on a frame-by-frame basis. The resultant encoded data is stored on a storage medium 64 such as an optical disk, a magnetooptical disk, a magnetic disk, or a semiconductor memory, or transmitted via a wired or wireless transmission media 65 such as the Internet. As the storage medium 64 for the above purpose, for example, the hard disk 35 or the removable storage medium 41 shown in FIG. 3 is used. As the transmission medium 65 for the above purpose, for example, the network 23 shown in FIG. 2 is used.

Encoded data read from the storage medium 64 or encoded data received via the transmission medium 65 is applied to the decoder 62. The decoder 62 decodes the received encoded data, on a frame-by-frame basis, into audio data in the form of PCM data, and outputs the resultant audio data.

The controller 63 controls the processes performed by the encoder 61 and the decoder 62.

The codec system shown in FIG. 4 may be used as an audio data coder/decoder in an application program such as an audio recorder/player for recording audio data by encoding the audio data and storing the resultant encoded data on the storage medium 64, or playing back audio data by reading encoded data from the storage medium 64 and decoding the read encoded data into audio data. The codec system more shown in FIG. 4 may also be used as an audio data coder/decoder in an application program such as an IP telephone system (Internet telephone system) that encodes audio data into encoded data and transmits the resultant encoded data via the transmission medium 65 such as the Internet and that receives encoded data via the transmission medium 65, decodes the received data into audio data, and outputs the resultant audio data.

As shown in FIG. 4, the encoder 61 includes an interpolator 51, a selector 52, a signal storage unit 53, and a frame encoder 54.

If a series of PCM data to be encoded is input to the encoder 61, the series of PCM data is applied to the interpolator 51. Under the control of controller 63, the interpolator 51 performs oversampling, by means of interpolation, on the received series of PCM data. The resultant oversampled data with as many samples as R times the number of samples included in the original PCM data is output to the signal storage unit 52. In the present embodiment, for example, R is set to be an integer equal to or greater than 1.

As for the signal storage unit 53, an FIFO (First In First Out) memory, a ring buffer, or the like may be used. The signal storage unit 53 is used to sequentially store PCM data supplied to the encoder 61 and oversampled. The signal storage unit 53 has a storage capacity capable of storing at least one frame. If the signal storage unit 53 has become full, data supplies thereafter to the signal storage unit 53 is stored such that oldest data stored in the signal storage unit 53 is replaced with new data.

Figure 1:
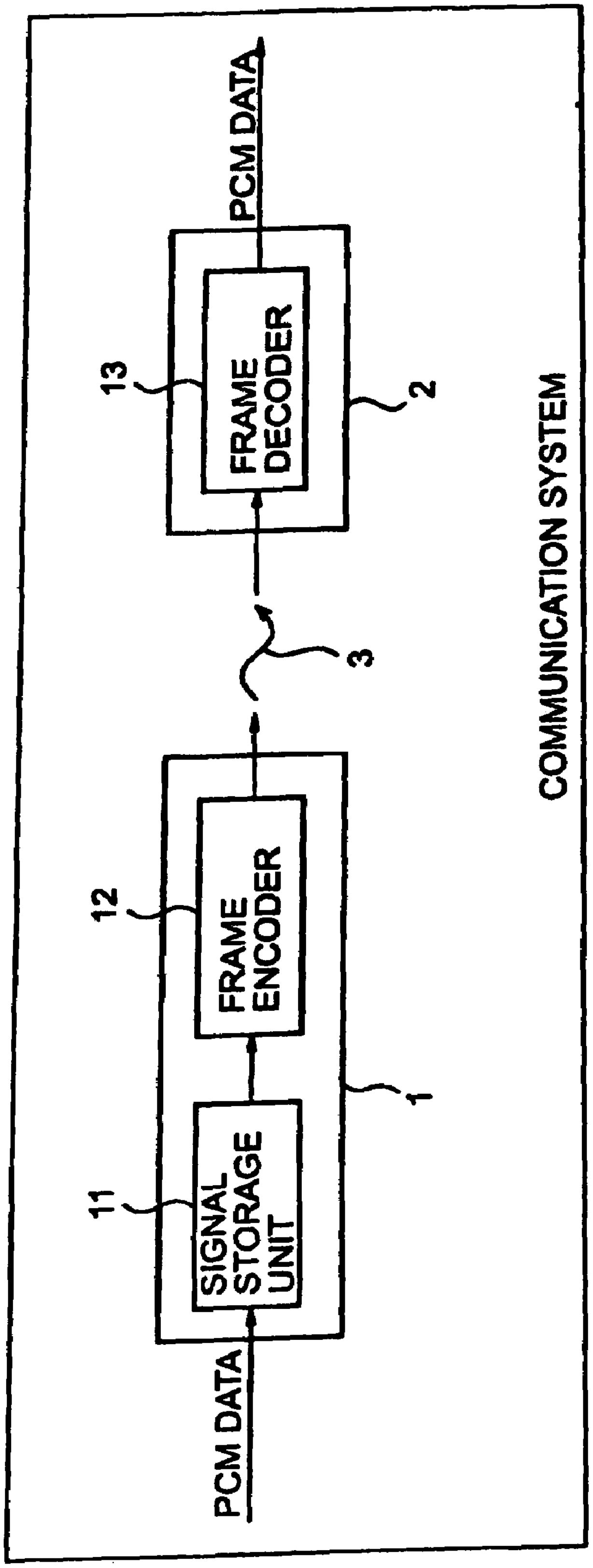
PRIOR ART FIG. 1
FIG. 1 is a block diagram showing an example of a construction of a conventional communication system.

As with the frame encoder 12 shown in FIG. 1, the frame encoder 54 fetches one frame of data including N samples that are oldest of those stored in the signal storage unit 53 and that have not yet been processed, and the frame encoder 54 performs signal analysis for quantization on the fetched one frame of data. More specifically, the frame encoder 54 performs an orthogonal transformation such as DFT (Discrete Fourier Transform), FFT (Fast Fourier Transform), DCT (Discrete Cosine Transform), or MDCT (Modified DCT), then encodes the resultant orthogonally transformed data by performing quantization or the like, and outputs the resultant encoded data. The encoded data output from the frame encoder 54 is stored on the storage medium 64 or transmitted via the transmission medium 65.

When the frame encoder 54 processes the oversampled data under the control of the controller 63, the frame encoder 54 performs processing at a rate R times higher than the rate at which the process is performed for the original PCM data if the oversampling is not performed.

As with the frame decoder 13 shown in FIG. 1, the frame decoder 55 performs inverse quantization on encoded data read from the storage medium 64 or received via the transmission medium 65, and the frame decoder 55 supplies resultant decoded data, as output data, to a decimator 56 and a selector 57.

Note that the process performed by the frame decoder 55 is an inverse process of the signal analysis process performed by the frame encoder 54. That is, if the frame encoder 54 performs orthogonal transformation as the signal analysis, for example, using an MDCT process, then the frame decoder 55 performs an inverse MDCT process as the inverse orthogonal transformation. In applications such as communication in which it is needed to perform the process in real time, when the frame decoder 55 processes, under the control of the controller 63, encoded data obtained from oversampled data, the frame decoder 55 needs to perform the process at a rate higher, by a factor of R, than the rate at which data obtained from the original non-oversampled PCM data would be processed.

Under the control of the controller 63, the decimator 56 decimates the output data supplied from the frame decoder 55, and the decimator 56 outputs, as decoded PCM data, resultant decimated data including samples whose number is 1/R times the number of samples included in the original output data.

Figure 5:
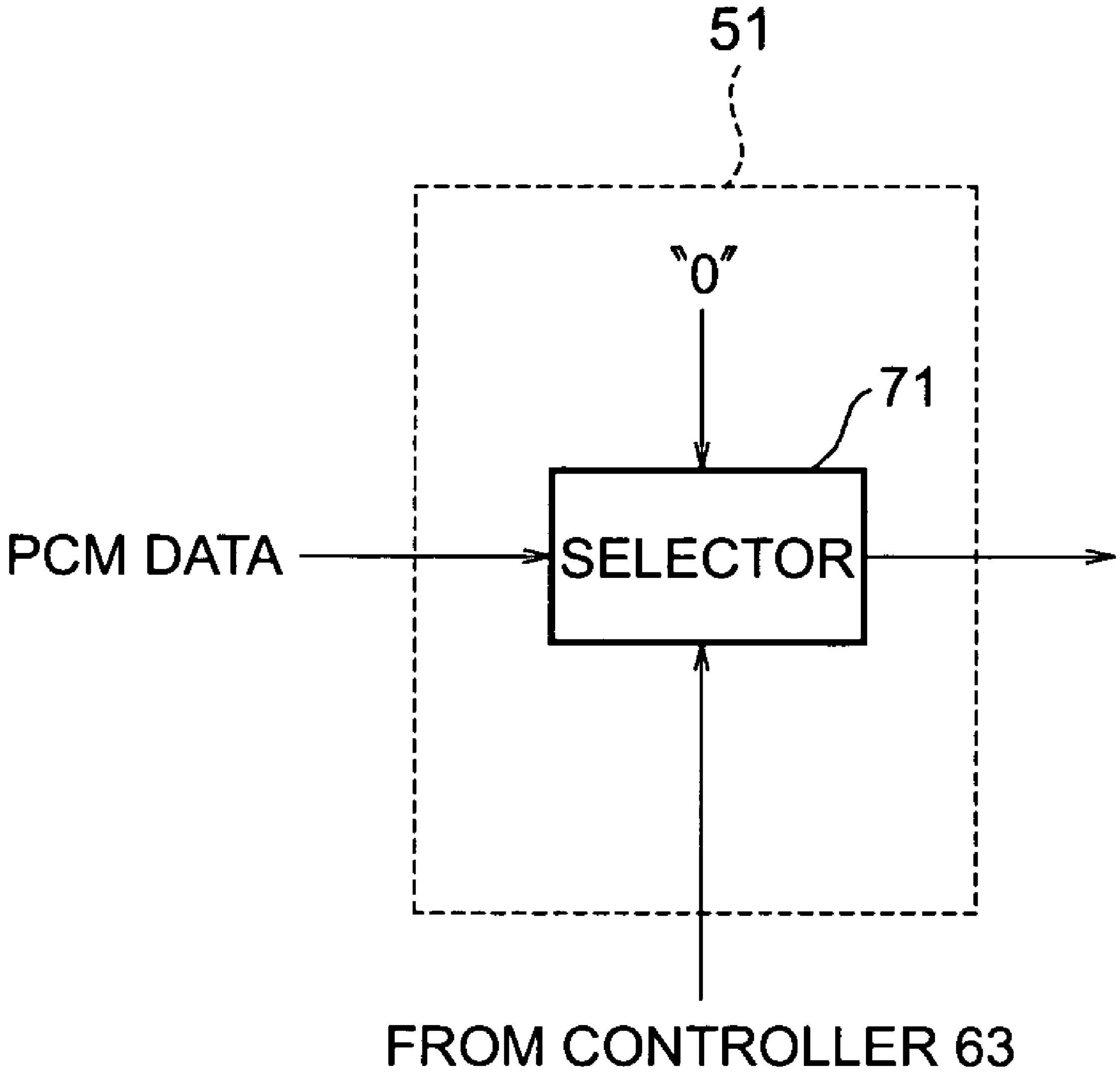
FIG. 5 is a block diagram showing a first example of a construction of an interpolator 51.

FIG. 5 shows a first example of the construction of the interpolator 51 shown in FIG. 4, which performs R-times oversampling.

In FIG. 5, the interpolator 51 interpolates 0 into PCM data supplies thereto, and outputs resultant interpolated data as oversampled data.

As shown in FIG. 5, the interpolator 51 includes a selector 71. PCM data to be encoded and data with a value of 0 (hereinafter, represented as 0-value data) are supplied to the selector 71. Under the control of the controller 63, the selector 71 selects PCM data or 0-value data, and outputs the selected data as oversampled data. More specifically, after the selector 71 selects PCM data supplies thereto, the selector 71 selects as many 0-value data as R−1. The selector 71 then selects PCM data supplies thereto. Thereafter, the selector 71 selects as many 0-value data as R−1. The selector 71 performs the above process repeatedly to insert 0-value data as many as R−1 between each adjacent PCM data sequentially supplied to the selector 71, and the selector 71 outputs the resultant data as oversampled data.

Figure 6:
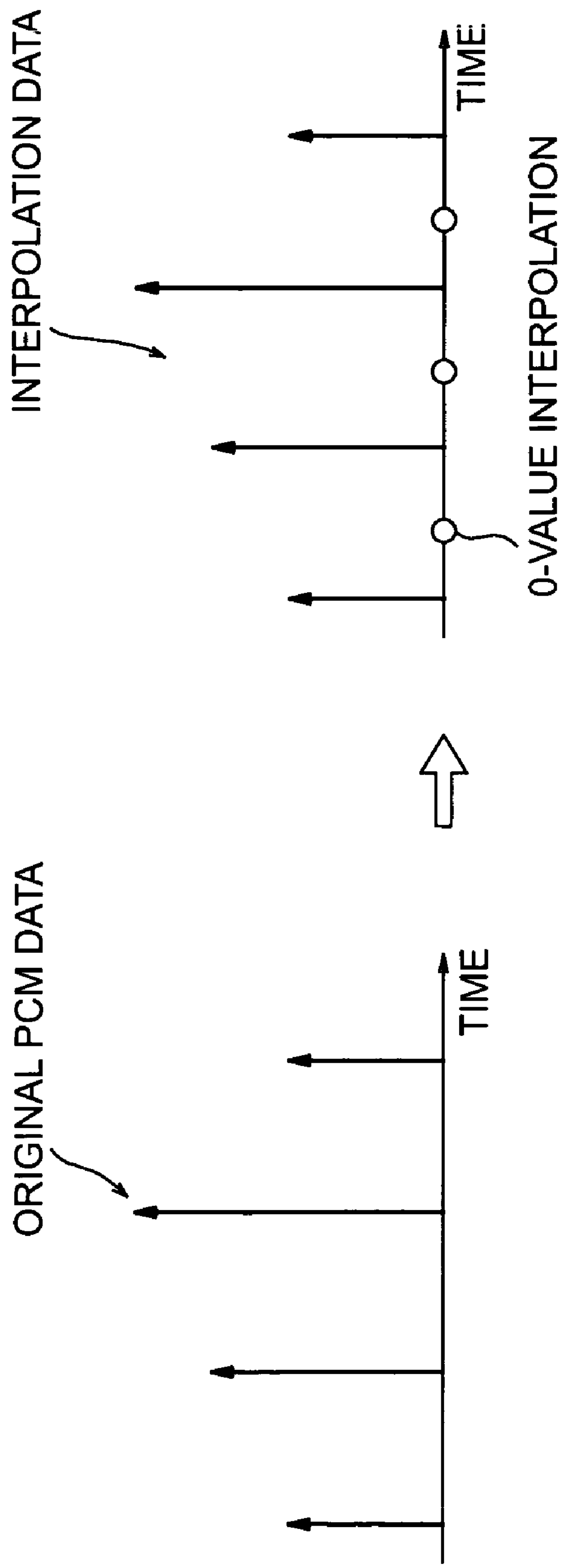
FIG. 6 is diagram showing oversampled data.

When R=2, the interpolator 51 shown in FIG. 5 outputs oversampled data such as that shown in FIG. 6.

That is, FIG. 6 shows oversampled data output by the interpolator 51 shown in FIG. 5, when R=2.

In the case of R=2, when PCM data shown on the left-hand side of FIG. 6 are input to the interpolator 51 shown in FIG. 5, the interpolator 51 inserts one 0-value data between each two adjacent samples of the input PCM data. As a result, oversampled data such as that shown on the right-hand side of FIG. 6 is output from the interpolator 51 shown in FIG. 5. As can be seen from FIG. 6, the oversampled data output from the interpolator 51 includes one 0-value data between each two adjacent samples of PCM data.

In FIG. 6, a time axis is taken in a horizontal direction such that time elapses from right to left in the figure, and an axis indicating sample values (sample levels) of PCM data (oversampled data) is taken in a vertical direction such that the positive direction of the axis is taken in the upward direction in the figure. Axes are defined in a similar manner also in FIG. 8 that will be described later.

Figure 7:
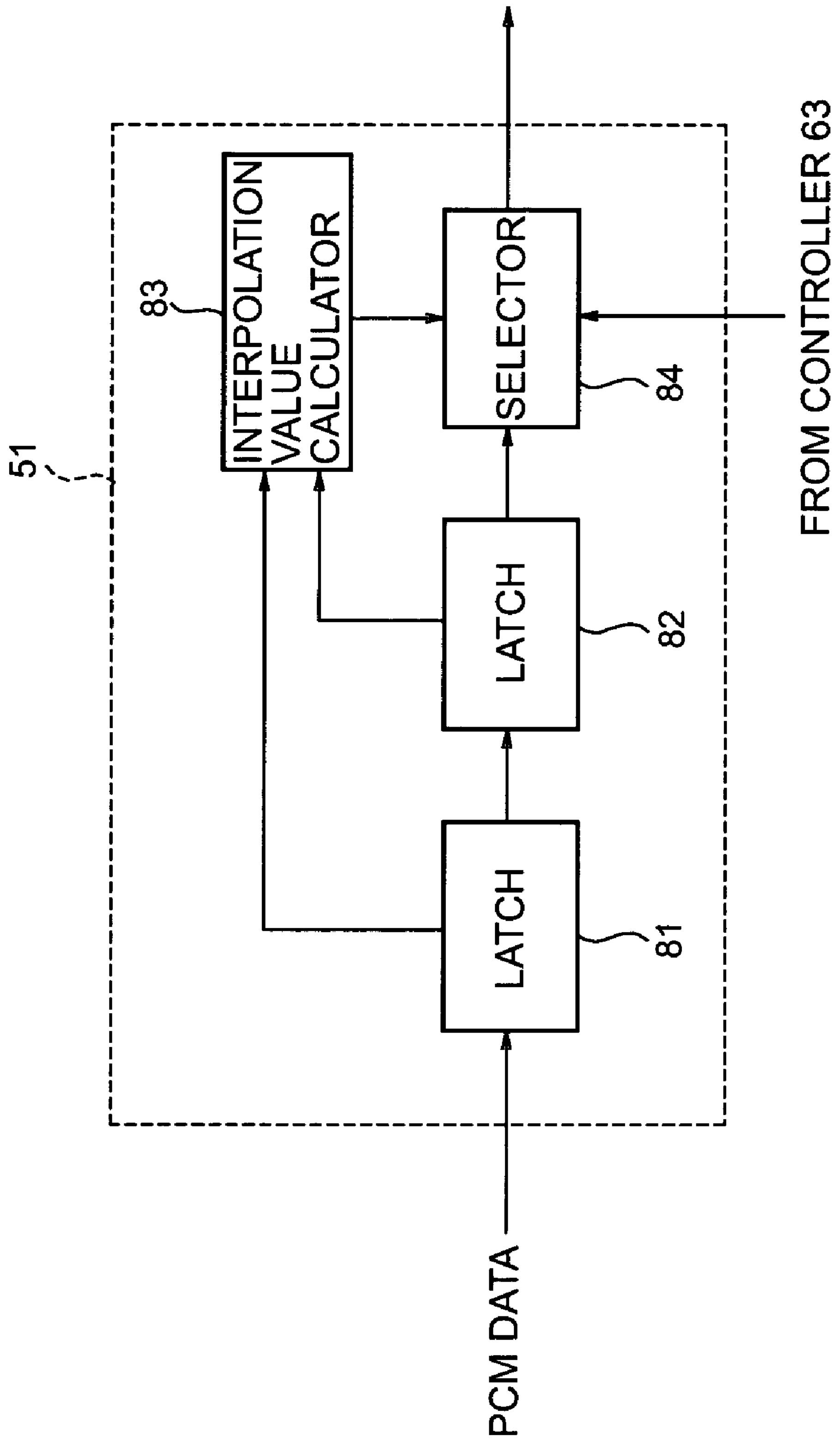
FIG. 7 is a block diagram showing a second example of a construction of an interpolator 51.

FIG. 7 shows a second example of the construction of the interpolator 51 shown in FIG. 4, which performs R-times oversampling.

In the construction shown in FIG. 7, the interpolator 51 calculates the sample values of samples to be interpolated into PCM data supplied to the interpolator 51, and interpolates the calculated sample values into the original PCM data. The resultant interpolated data is output as oversampled data.

That is, the interpolator 51 shown in FIG. 7 includes latches 81 and 82, an interpolation value calculator 83, and a selector 84.

The latch 81 sequentially latches, one by one, samples of the PCM data supplied to the interpolator 51 and supplies the latched sample data to the latch 82 and the interpolation value calculator 83. The latch 82 latches, one by one, samples of the PCM data supplied from the latch. Thus, when a sample of the PCM data is latched in the latch 81, the latch 82 latches a sample immediately previous to the sample latched in the latch 81.

The interpolation value calculator 83 calculates the linear-interpolation sample value of each of R−1 samples to be inserted between the two adjacent samples, respectively latched in the latches 81 and 82, of the PCM data, and the interpolation value calculator 83 supplies the calculated values to the selector 84. Note that the method of calculating the interpolation values to be inserted between two adjacent samples of PCM data is not limited to the linear interpolation.

Under the control of the controller 63, the selector 84 selects the sample of the PCM data latched in the latch 82 or the R−1 samples supplied from the interpolation value calculator 83, and the selector 84 outputs the selected data as oversampled data. More specifically, when a new sample of PCM data is latched by the latch 82, the selector 84 selects that sample. After one sample is latched, the selector 84 sequentially selects R−1 samples supplied from the interpolation value calculator 83. By repeatedly performing selecting one sample of PCM data latched by the latch 82 and then selecting following R−1 samples supplied from the interpolation value calculator 83, the selector 84 inserts R−1 samples between each two adjacent samples of PCM data supplied to the interpolator 51. The resultant data is output as oversampled data from the selector 84.

Figure 8:
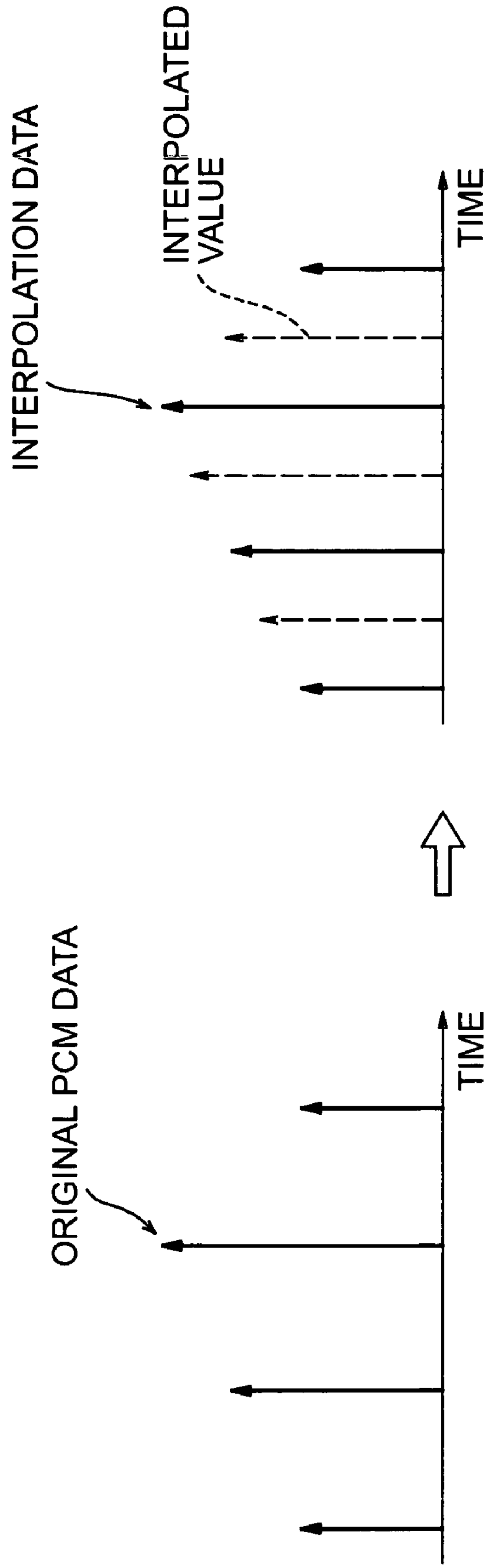
FIG. 8 is diagram showing oversampled data.

Thus, for example, when R=2, oversampled data such as that shown in FIG. 8 is output from the interpolator 51 shown in FIG. 7.

That is, FIG. 6 shows oversampled data output by the interpolator 51 shown in FIG. 7, when R=2.

In the case of R=2, when PCM data shown on the left-hand side of FIG. 8 are input to the interpolator 51 shown in FIG. 7, the interpolator 51 inserts a linear interpolation value (hereinafter, also referred to simply as an interpolation value) between each two adjacent samples of the input PCM data. As a result, oversampled data such as that shown on the right-hand side of FIG. 8 is output from the interpolator 51 shown in FIG. 7. As can be seen from FIG. 8, the oversampled data output from the interpolator 51 includes one interpolated value data between each two adjacent samples of PCM data.

Figure 9:
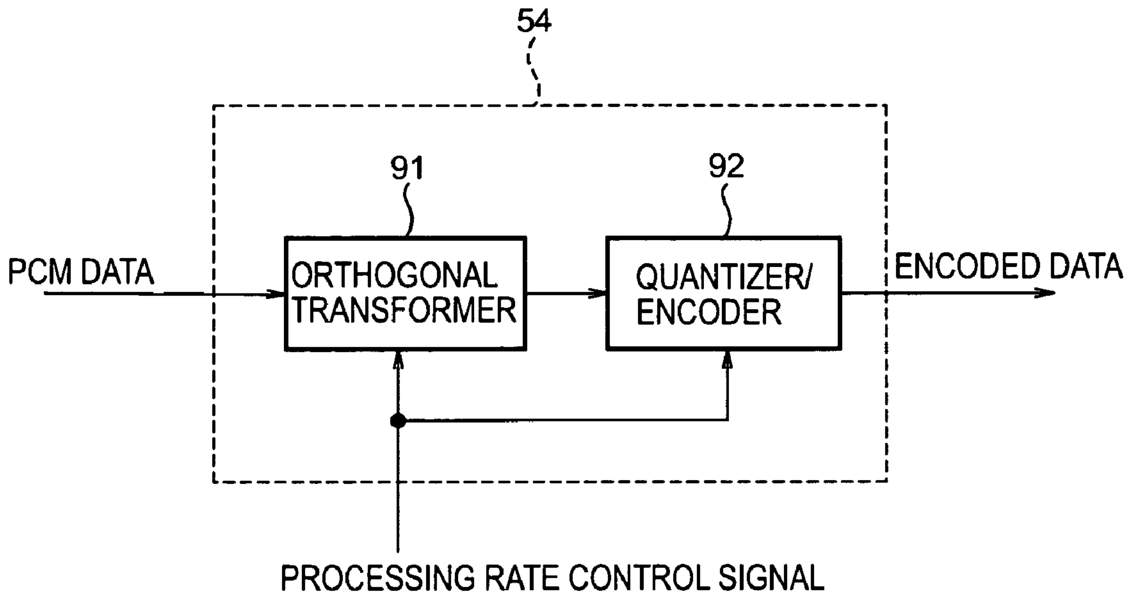
FIG. 9 is a block diagram showing an example of a construction of a frame encoder 54.

FIG. 9 shows an example of the construction of the frame encoder 54 shown in FIG. 4.

As shown in FIG. 9, the frame encoder 54 includes an orthogonal transformer 91 and a quantizer/encoder 92. The orthogonal transformer 91 reads one frame of PCM data from the signal storage unit 53, and performs an orthogonal transformation on the read one frame of PCM data. The resultant orthogonally transformed data is supplied to the quantizer/encoder 92. The quantizer/encoder 92 quantizes the orthogonally transformed data supplied from the orthogonal transformer 91, and outputs resultant data as encoded data.

The orthogonal transformer 91 and the quantizer/encoder 92 perform the processes at a rate according to a frame processing rate control signal supplied from the controller 63.

More specifically, when the frame encoder 54 performs the process for non-interpolated PCM data, the controller 63 supplies, to the orthogonal transformer 91 and the quantizer/encoder 92, a processing rate control signal indicating that the process should be performed at a normal rate (frame rate) in a normal mode. In response to the control signal, the orthogonal transformer 91 and the quantizer/encoder 92 perform the processes in the normal mode.

On the other hand, when the frame encoder 54 performs the process for oversampled data, the controller 63 supplies, to the orthogonal transformer 91 and the quantizer/encoder 92, a processing rate control signal indicating that the process should be performed in a high rate mode in which the process is performed at a rate R times higher than the normal rate. In this case, the orthogonal transformer 91 and the quantizer/encoder 92 perform the processes in the high rate mode according to the control signal.

Now, PCM data, which is subjected to the process performed by the frame encoder 54 (and further by the frame decoder 55), is described below.

In the following discussion, PCM data to be encoded will be referred to as original PCM data when it is distinguished from oversampled PCM data.

Figure 10:
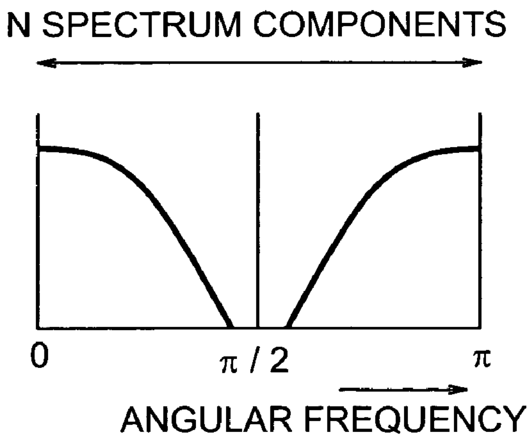
FIG. 10 is diagram showing a spectrum of PCM data.

When the frame encoder 54 performs the orthogonal transformation on one frame of PCM data including N samples, the one frame of original PCM data has a spectral distribution such as that shown in FIG. 10. Note that the spectral distribution of PCM data can be determined, for example, as a result of FFT transformation of PCM data.

In the plot of the spectral distribution obtained by performing FFT on original PCM data in FIG. 10, the angular frequency is represented along a horizontal axis, while the magnitude of spectrum component (frequency component) is represented along a vertical axis. Note that spectral components of PCM data appear at discrete points of angular frequencies, but, in FIG. 10, for simplicity, the spectrum is represented such that it is continuously distributed. Spectra are represented in a similar manner also in FIGS. 11 to 14, FIG. 20, and FIG. 22.

If original PCM data including N samples is subjected to an FFT transformation, N spectral components appear at equal intervals of angular frequency in a range from 0 to $\pi$. When the sampling frequency of the original PCM data is denoted by Fs (Hz), an angular frequency $\pi/2$ corresponds to Fs/2 (Hz) (Nyquist Frequency), and spectral components in the range from $\pi/2$ to $\pi$ are distributed in the form mirror symmetric to the distribution of spectral components in the range from 0 to $\pi/2$, as shown in FIG. 10.

When the original PCM data is processed by the frame encoder 54, the PCM data has spectral components in the range of angular frequency from 0 to $\pi/2$, as shown in FIG. 10.

Figure 11:
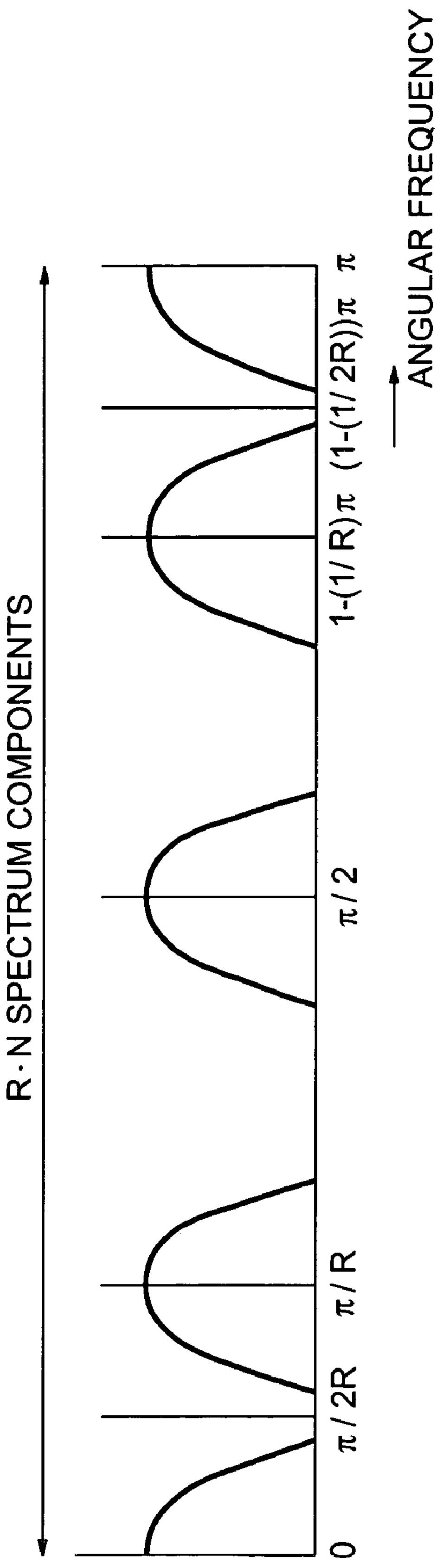
FIG. 11 is diagram showing a spectrum of PCM data oversampled in a 0-filling mode.

FIG. 11 shows a spectrum obtained as a result of an FFT process performed on PCM data including N×R samples obtained by performing R-times oversampling on original PCM data including N samples such that as many 0-values as R−1 are interpolated between each two adjacent samples of the original PCM data including N samples (hereinafter, such oversampling will be referred to as 0-filling oversampling).

If oversampled data including N×R samples is subjected to the FFT process, N×R spectral components appear at equal intervals of angular frequency in a range from 0 to $\pi$. In FIG. 11, an angular frequency $\pi/2$ corresponds to R×Fs/2, and spectral components, which are aliasing of spectral components in the range from 0 to $\pi/2$, appear at angular frequencies equal to integral multiples of a frequency Fs.

Figure 12:
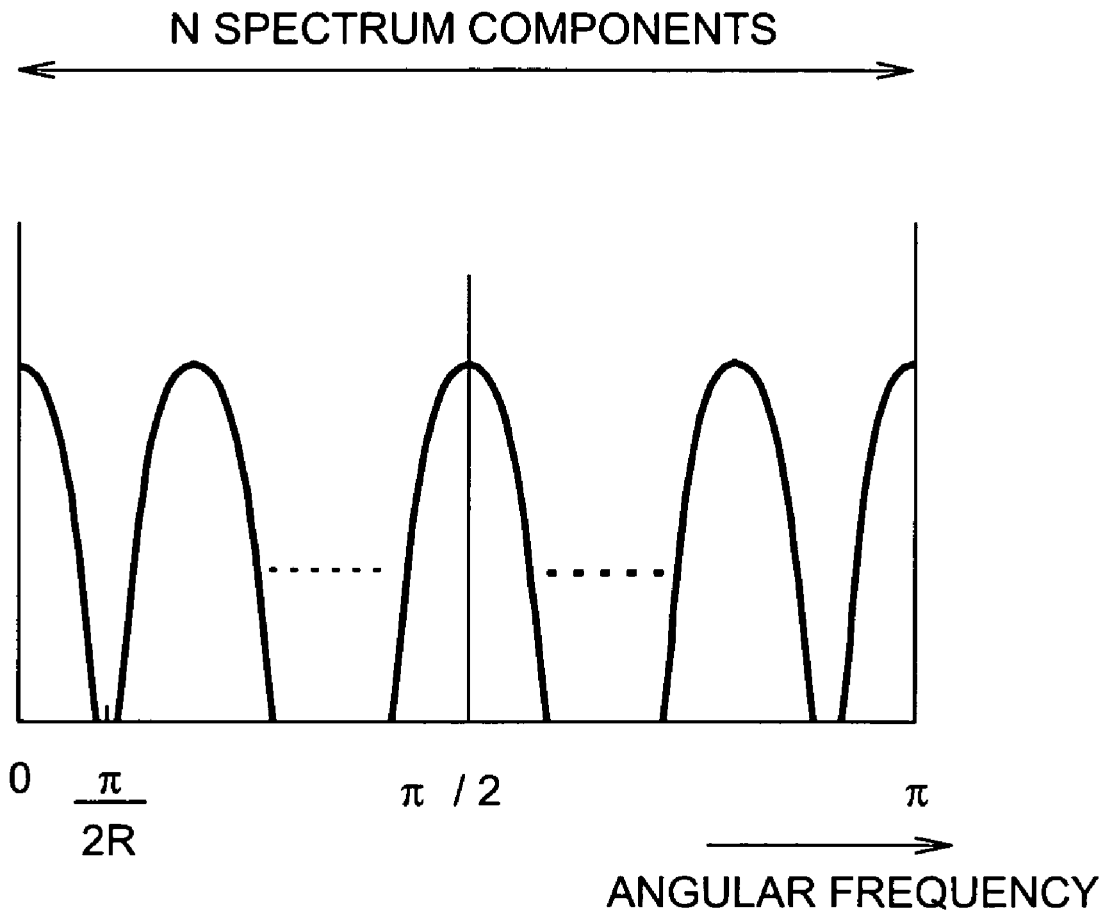
FIG. 12 is diagram showing a spectrum of PCM data oversampled in the 0-filling mode.

FIG. 12 shows a spectrum obtained as a result of an FFT process performed on PCM data including N samples obtained by performing R-times 0-filling oversampling on original PCM data including N/R samples such that as many 0-values as R−1 are interpolated in the original PCM data.

The spectrum obtained as a result of the FFT process on oversampled data including N samples is equivalent to a spectrum obtained by decimating the spectrum obtained as a result of the FFT process on oversampled data including N×R samples shown in FIG. 11 such that the number of spectral components distributed along the angular frequency axis is reduced to 1/R. That is, if oversampled data including N samples is subjected to the FFT process, N spectral components appear at equal intervals of angular frequency in the range from 0 to $\pi$, and an aliasing components appear which are similar to those in the oversampled data including N×R samples shown in FIG. 11.

Because the frame encoder 54 processes PCM data on a basis of frame-by-frame basis, that is, processes PCM data in units of N samples, oversampled data subjected to the process performed by the frame encoder 54 is oversampled data including N samples obtained by interpolating as many 0-values as R−1 between each adjacent samples of original PCM data including N/R samples.

Thus, in the case where the first example of the construction shown in FIG. 5 is employed for the interpolator 51 shown in FIG. 4, that is, in the case where the interpolator 51 shown in FIG. 4 is configured to perform 0-filling interpolation, oversampled PCM data subjected to the process by the frame encoder 54 has spectral components distributed in the range of angular frequency from 0 to π/2 as shown in FIG. 12.

The interpolator 51 can acquire oversampled data including N samples by interpolating as many 0-values as R−1 between each adjacent samples of original PCM data including N/R samples, in a short time that is 1/R times the time needed to acquire N samples of original PCM data. Thus, in the system in which the oversampled data produced by the interpolator 51 is processed by the frame encoder 54, it is possible to reduce the algorithm delay to as small a value as 1/R times the delay which occurs when original PCM data is directly processed.

However, in the system in which the oversampled data produced by the interpolator 51 is processed by the frame encoder 54, because oversampled data including N samples (one frame of data) is sequentially obtained in a short time that is 1/R of the time needed to acquire N samples of original PCM data, the frame encoder 54 needs to perform the process at a rate higher by a factor of R than the rate at which the original PCM data is directly processed. Thus, in the system in which oversampled data is processed by the frame encoder 54, the frame encoder 54 is configured to perform the process at the rate higher by the factor of R than the rate at which the original PCM data is directly processed.

In the oversampled data to be subjected to the process by the frame encoder 54, the spectral components in the range of angular frequency from 0 to π/2 shown in FIG. 12 include components which appear at angular frequencies corresponding to integral multiples of frequency Fs and which are aliasing of spectral components in the range of angular frequency from 0 to π/(2R). The frame encoder 54 (quantizer/encoder 92) needs to process only spectral components in the range of angular frequency from 0 to π/(2R), but it is not necessary to process the spectrum components in the range of angular frequency higher than π/(2R).

Therefore, when the frame encoder 54 performs the process on data obtained as a result of 0-filling oversampling, it is not necessary to process the aliasing components (spectral components in the range of angular frequency higher than π(2R)) of the oversampled data, although it is necessary to perform the process at a rate R times higher than the rate at which original PCM data is directly processed. That is, it is needed to process only components of oversampled data other than aliasing components, it is possible to reduce the total amount of processing to a level much lower than R times the amount of processing needed to process the original PCM data.

Figure 13:
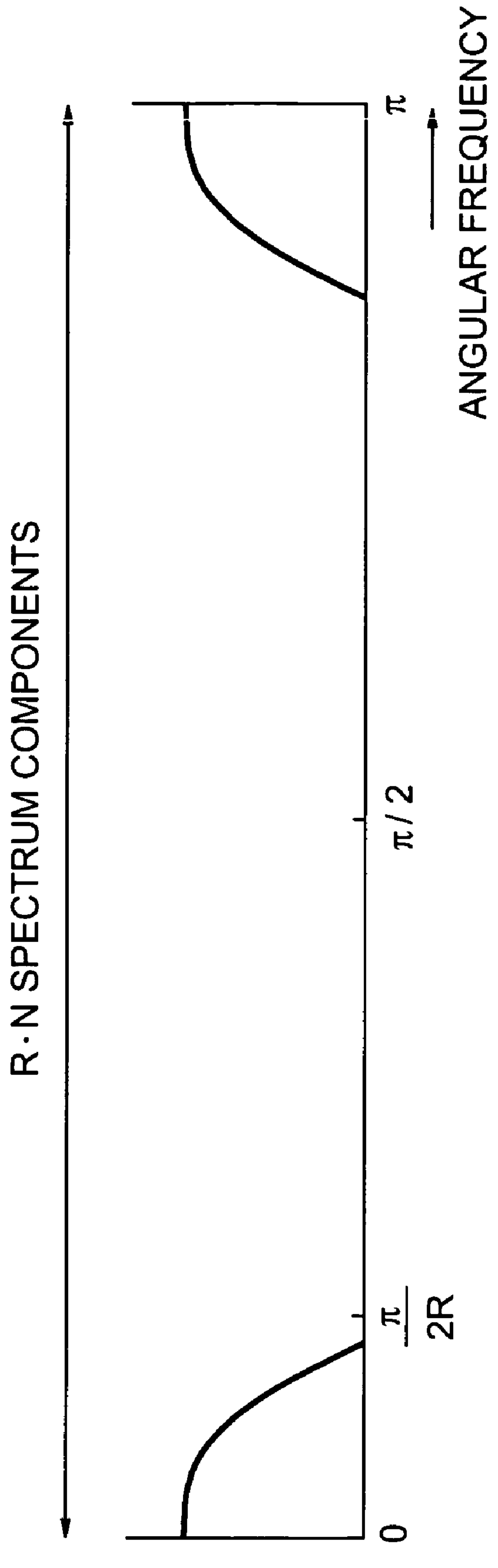
FIG. 13 is diagram showing a spectrum of PCM data oversampled in a band-limited mode.

FIG. 13 shows a spectrum obtained as a result of an FFT process performed on oversampled PCM data including N×R samples obtained by performing R-times oversampling in such a manner that interpolation values are interpolated between each adjacent samples of original PCM data including N samples.

If oversampled data including N×R samples is subjected to the FFT process, N×R spectral components appear at equal intervals of angular frequency in the range from 0 to π. In FIG. 13, angular frequency π/2 corresponds to R×Fs/2 (Hz).

In the oversampled data obtained by inserting interpolation values, spectral components in the range of angular frequency from 0 to π/(2R) and in the range from (1-1/)2R)) π to π are similar to those appearing in the range of angular frequency from 0 to π/2 and in the range from π/2 to π shown in FIG. 10, but aliasing components such as those shown in FIG. 11 do not appear at angular frequencies corresponding to integral multiples of frequency Fs. Thus, the spectrum (shown in FIG. 13) of the oversampled data obtained by inserting interpolation values is equivalent to a spectrum obtained by band-limiting the oversampled data obtained by the 0-filling oversampling shown in FIG. 11 so as to reject the aliasing components. Hereinafter, the R-times oversampling performed by inserting interpolation values will be referred to as band-limited oversampling.

Figure 14:
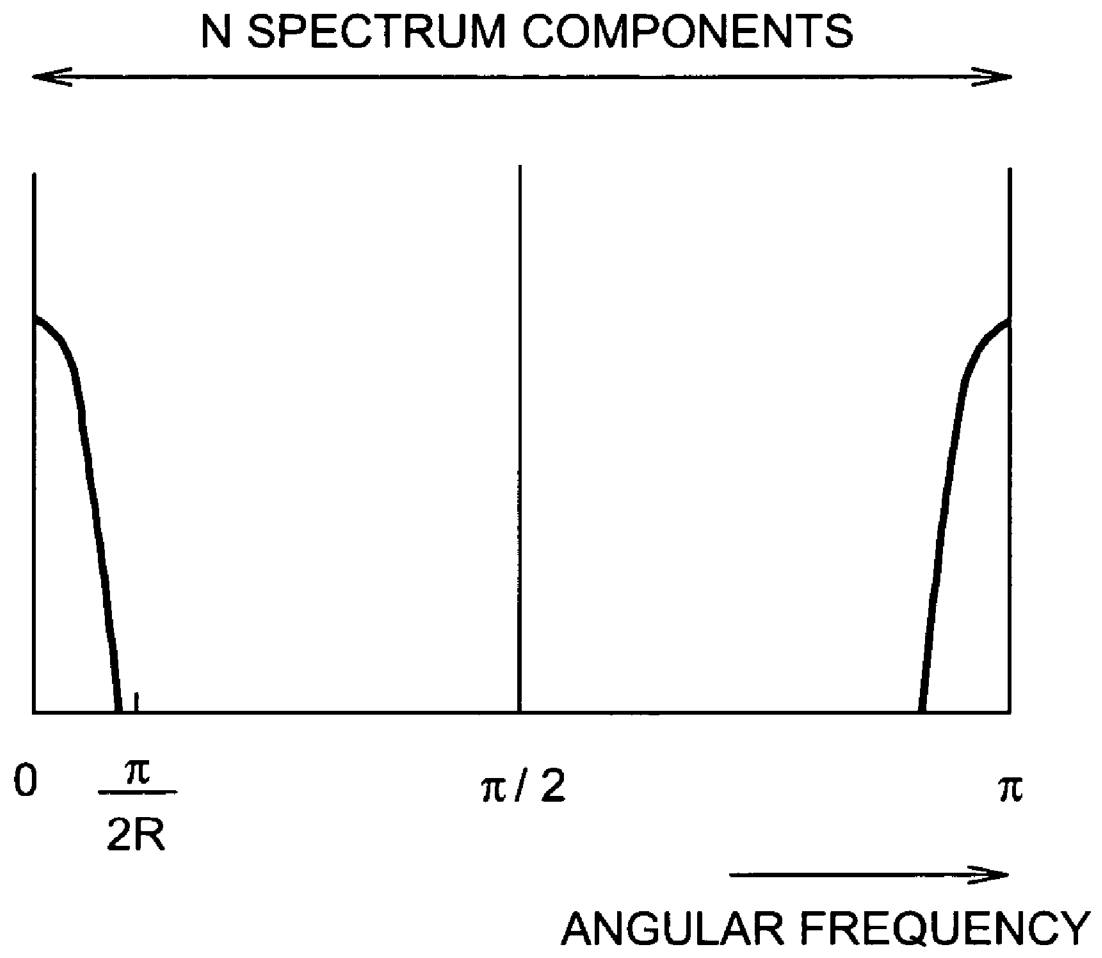
FIG. 14 is diagram showing a spectrum of PCM data oversampled in the band-limited mode.

FIG. 14 shows a spectrum obtained as a result of an FFT process performed on PCM data including N samples obtained by performing R-times band-limited oversampling on original PCM data including N/R samples such that as many interpolation values as R−1 are interpolated in the original PCM data.

The spectrum obtained as a result of the FFT process on oversampled data including N samples is equivalent to a spectrum obtained by decimating the spectrum obtained as a result of the FFT process on oversampled data including N×R samples shown in FIG. 13. That is, if oversampled data including N samples is subjected to the FFT process, N spectral components appear at equal intervals of angular frequency in a range from 0 to π. This spectrum, as that shown in FIG. 13, includes spectral components in the range of angular frequency from 0 to π/(2R) and in the range from (1−1/)2R)) π to π are similar to those appearing in the range of angular frequency from 0 to π/2 and in the range from π/2 to π shown in FIG. 10, but aliasing components do not appear at angular frequencies corresponding to integral multiples of frequency Fs.

Because the frame encoder 54 processes PCM data on a basis of frame-by-frame basis, that is, processes PCM data in units of N samples, oversampled data subjected to the process performed by the frame encoder 54 is oversampled data including N samples obtained by interpolating as many interpolation values as R−1 between each adjacent samples of original PCM data including N/R samples.

Thus, in the case where the second example of the construction shown in FIG. 7 is employed for the interpolator 51 shown in FIG. 4, that is, in the case where the interpolator 51 shown in FIG. 4 is configured to perform interpolation by inserting interpolation values, oversampled PCM data subjected to the process by the frame encoder 54 has spectral components in the range of angular frequency from 0 to π/2, as shown in FIG. 14.

The interpolator 51 can acquire oversampled data including N samples by interpolating as many interpolation values as R−1 between each adjacent samples of original PCM data including N/R samples, in a short time that is 1/R times the time needed to acquire N samples of original PCM data. Thus, in the system in which the oversampled data produced by the interpolator 51 is processed by the frame encoder 54, it is possible to reduce the algorithm delay to as small a value as 1/R times the delay which occurs when original PCM data is directly processed.

However, in the system in which the oversampled data produced by the interpolator 51 is processed by the frame encoder 54, because oversampled data including N samples (one frame of data) is sequentially obtained in a short time that is 1/R of the time needed to acquire N samples of original PCM data, the frame encoder 54 needs to perform the process at a rate higher by a factor of R than the rate at which the original PCM data is directly processed. Thus, in the system in which oversampled data is processed by the frame encoder 54, as described above, the frame encoder 54 is configured to perform the process at the rate higher by the factor of R than the rate at which the original PCM data is directly processed.

In the oversampled data to be subjected to the process by the frame encoder 54, of the spectral components in the range of angular frequency from 0 to π/2 shown in FIG. 14, spectral components at angular frequencies equal to or higher than π/(2R) are equal to 0. The frame encoder 54 (quantizer/encoder 92) needs to process only spectral components in the range of angular frequency from 0 to π/(2R), but it is not necessary to process the spectrum components in the range of angular frequency higher than π/(2R).

Therefore, when the frame encoder 54 performs the process on data obtained as a result of band-limited oversampling, it is not necessary to process spectral components at angular frequencies equal to or higher than π/(2R) of the oversampled data, although it is necessary to perform the process at a rate R times higher than the rate at which original PCM data is directly processed. That is, the frame encoder 54 needs to process the oversampled data only for spectral components in the range of angular frequency from 0 to π/(2R), and thus it is possible to reduce the total amount of processing to a level much-lower than R times the amount of processing needed to process the original PCM data.

As described above, regardless of whether oversampled data is obtained by the 0-filling oversampling or the band-limited oversampling, the frame encoder 54 processes the oversampled data at a rate R times higher than the rate at which original PCM data is directly processed. However, because it is not necessary to process the spectrum components of the oversampled data in the range of angular frequency higher than π/(2R), it is possible to reduce the total amount of processing to a level much lower than R times the amount of processing needed to process the original PCM data.

The above discussion applies to the frame decoder 55 that performs a process corresponding to the process performed by the frame encoder 54. The controller 63 controls the frame encoder 54 and the frame decoder 55 such that only spectral components in the range of angular frequency from 0 to π/(2R) are processed.

Figure 15:
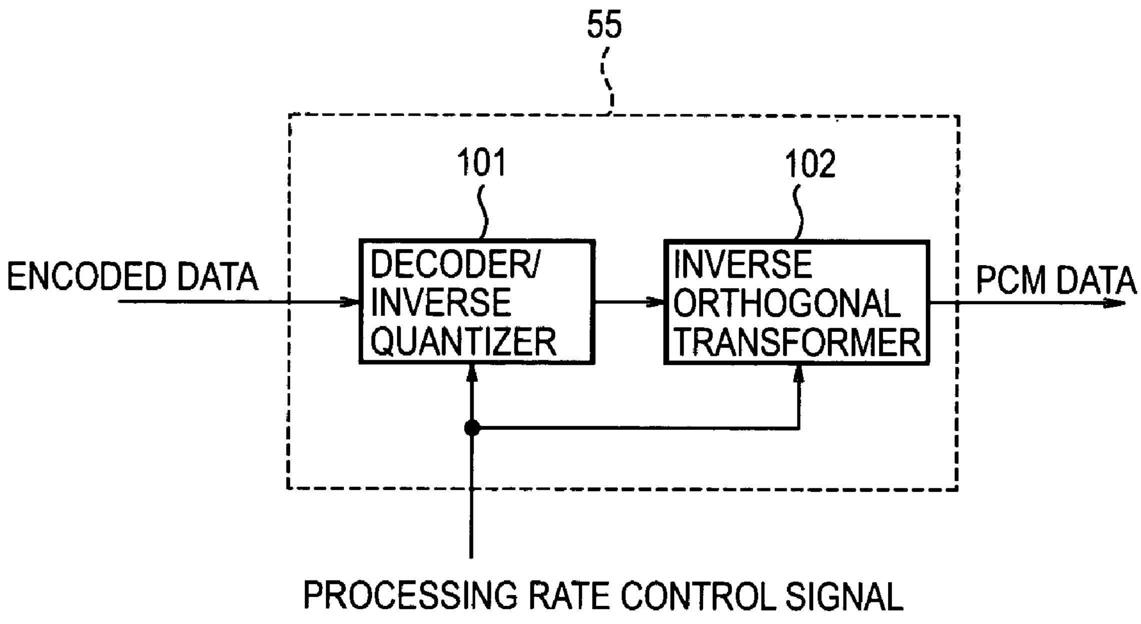
FIG. 15 is a block diagram showing an example of a construction of a frame decoder 55.

FIG. 15 shows an example of a construction of the frame decoder 55 shown in FIG. 4.

The encoded data read from the storage medium 64 or received via the transmission medium 65 is supplied to a decoder/inverse quantizer 101. The decoder/inverse quantizer 101 performs inverse quantization on the supplied encoded data thereby decoding it into orthogonally-transformed data. The resultant orthogonally-transformed data is supplied to an inverse orthogonal transformer 102. The inverse orthogonal transformer 102 performs an inverse orthogonal transformation on the orthogonally transformed data supplied from the decoder/inverse quantizer 101 on a frame-by-frame basis, and supplies, as output data, PCM data obtained as a result of the inverse orthogonal transformation to the decimator 56 and the selector 57.

The above-described processes by the decoder/inverse quantizer 101 and the inverse orthogonal transformer 102 are performed at a rate according to a processing rate control signal supplied from the controller 63.

More specifically, when the frame decoder 55 processes encoded data obtained from non-interpolated original PCM data, the controller 63 supplies, to the decoder/inverse quantizer 101 and the inverse orthogonal transformer 102, a processing rate control signal indicating that the process should be performed at a normal rate in a normal mode. In this case, in accordance with the control signal, the decoder/inverse quantizer 101 and the inverse orthogonal transformer 102 perform the processes in the normal mode.

On the other hand, when the frame decoder 55 processes encoded data obtained from oversampled data, the controller 63 supplies, to the decoder/inverse quantizer 101 and the inverse orthogonal transformer 102, a processing rate control signal indicating that the process should be performed in a high rate mode in which the process is performed at a rate R times higher than the normal rate. In this case, in accordance with the control signal, the decoder/inverse quantizer 101 and the inverse orthogonal transformer 102 perform the processes in the high rate mode.

Now, referring to flow charts shown in FIGS. 16 to 19, the process performed by the codec system shown in FIG. 4 is described.

When the codec system is used to encode and decode audio data in a storage application program such as an audio recorder/player that records audio data in an encoded form on a storage medium 64 or plays back audio data by reading encoded data from the storage medium 64 and decoding the encoded data into audio data, the codec system is responsible for the process of storing encoded data on the storage medium 64 and playback encoded data from the storage medium 64.

When the codec system is used to encode and decode audio data in a transmission application program in which processing is performed in real time, such as an IP telephone system (Internet telephone system) in which audio data in an encoded form is transmitted via the transmission medium 65 such as the Internet, and the encoded data received via the transmission medium 65 is decoded into audio data and output, the codec system is responsible for the process of transmitting encoded data via the transmission medium 65 and receiving encoded data transmitted via the transmission medium 65.

An IP telephone system can be used to perform telephonic communications, for example, between information processing apparatus 21 and 22 shown in FIG. 2.

Figure 16:
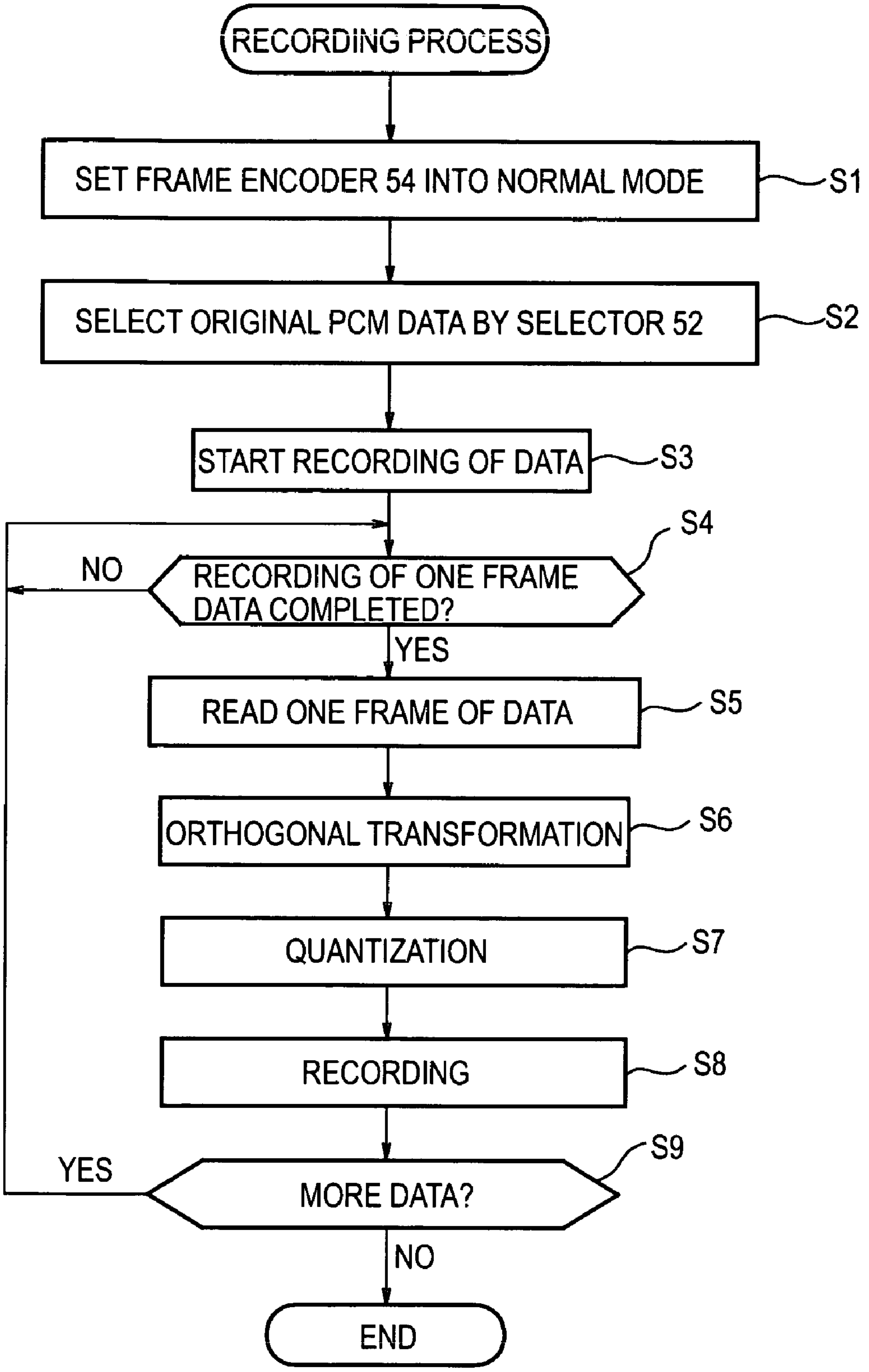
FIG. 16 is a flowchart showing a recording process.

First, referring to a flow chart shown in FIG. 16, the process of recording audio data on the storage medium 64 is described.

The recording process is started, for example, when audio data in the form of PCM data to be recorded is supplied to the codec system.

First, in step S1 of the recording process, the controller 63 controls the frame encoder 54 so as to operate in the normal mode. That is, in step S1, the operation mode of the frame encoder 54 is set to the normal mode, and the frame encoder 54 starts the process at the predetermined normal rate.

After the process in step S1 is completed, the process proceeds to step S2. In step S2, the controller 63 controls the selector 52 such that, of original PCM data and oversampled data output from the interpolator 51, the original PCM data is selected. As a result, the original PCM data is supplied from the selector 52 to the signal storage unit 53.

Thereafter, the process proceeds from step S2 to step S3. In step S3, the signal storage unit 53 starts storing the original PCM data supplied from the selector 52. The process then proceeds to step S4.

In step S4, the frame encoder 54 determines whether one frame of original PCM data has been stored in the signal storage unit 53. If it is determined that data has not yet been stored, the process returns to step S4. On the other hand, if it is determined in step S4 that one frame of original PCM data has been stored in the signal storage unit 53, the process proceeds to step S5. In step S5, The orthogonal transformer 91 of the frame encoder 54 (FIG. 9) reads one frame of original PCM data from the signal storage unit 53. The process then proceeds to step S6.

In step S6, the orthogonal transformer 91 performs an orthogonal transformation on the one frame of original PCM data read, in the immediately previous step S5, from the signal storage unit 53, and the orthogonal transformer 91 supplies the resultant orthogonally transformed data to the quantizer/encoder 92. The process then proceeds to step S7. In step S7, the quantizer/encoder 92 quantizes the orthogonally transformed data supplied from the orthogonal transformer 91, thereby producing encoded data. The process then proceeds to step S8.

Note that in the above process, step S6 performed by the orthogonal transformer 91 and step S7 performed by the quantizer/encoder 92 are carried out at a predetermined normal rate (that allows original PCM data to be processed on a frame-by-frame basis).

In step S8, the frame encoder 54 records encoded data on the storage medium 64. The process then proceeds to step S9. In step S9, the frame encoder 54 determines whether there is more unprocessed PCM data in the signal storage unit 53. If it is determined that there is such data in the signal storage unit 53, the process returns to step S4 to repeat the process from step S4.

In the case where it is determined in step S9 that there is no more unprocessed PCM data stored in the signal storage unit 53, the recording processing is ended.

Figure 17:
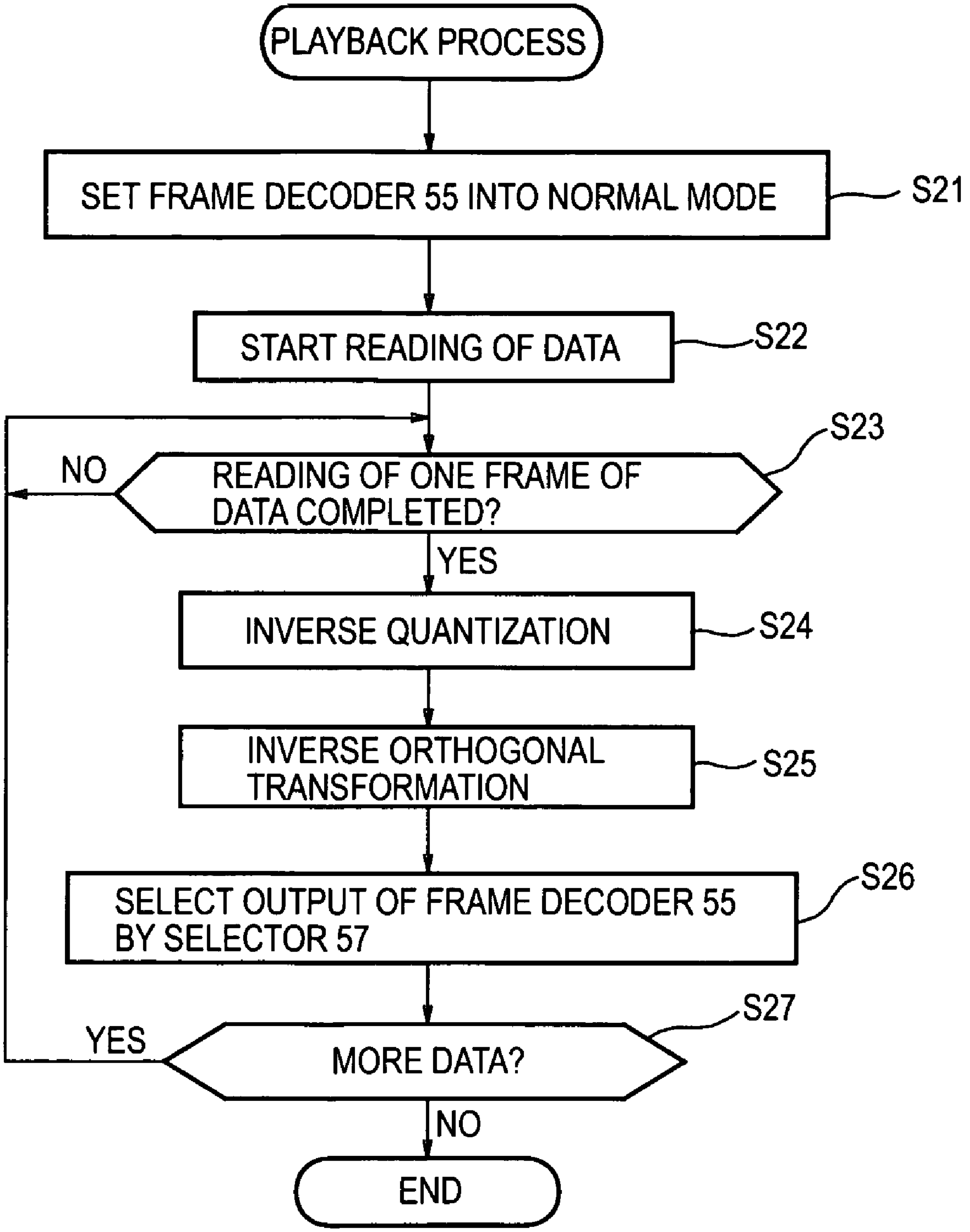
FIG. 17 is a flowchart showing a playback process.

Now, referring to a flow chart shown in FIG. 17, a playback process of playing back audio data stored on the storage medium 64.

The playback process is started, for example, when a user issues an audio data playback command by operating the input unit 37 (FIG. 3).

First, in step S21 in the playback process, the controller 63 controls the frame decoder 55 so as to operate in the normal mode. That is, in step S21, the operation mode of the frame decoder 55 is set to the normal mode, and the frame decoder 55 starts the process at the predetermined normal rate.

After the process in step S21 is completed, the process proceeds to step S22. In step S22, the frame decoder 55 starts reading the encoded data from the storage medium 64. The process then proceeds to step S23.

In step S23, the frame decoder 55 determines whether one frame of encoded data has been read from the storage medium 64, If it is determined that data has not yet been read, the process returns to step S23. On the other hand, if it is determined in step S23 that one frame of encoded data has been read from the medium 64, the process proceeds to step S24. In step S24, the decoder/inverse quantizer 101 of the frame decoder 55 (FIG. 15) performs an inverse quantization process on the one frame of encoded data thereby decoding it into orthogonally transformed data. The resultant data is supplied to the inverse orthogonal transformer 102. The process then proceeds to step S25. In step S25, the inverse orthogonal transformer 102 performs an inverse orthogonal transformation on the orthogonally transformed data supplied from the decoder/inverse quantizer 101, and the inverse orthogonal transformer 102 supplies the resultant PCM data as output data to the selector 57. The process then proceeds to step S26.

Note that in the above process, step S24 performed by the decoder/inverse quantizer 101 and step S25 performed by the inverse orthogonal transformer 102 are carried out at a predetermined normal rate (that allows encoded data to be processed on a frame-by-frame basis).

In step S26, the selector 57 selects the data output from the inverse orthogonal transformer 102 and outputs the selected data. The process then proceeds to step S27. The audio data output from the selector 57 is supplied, for example, to the output unit 36 (FIG. 3) and is output to the outside.

In step S27, the frame decoder 55 determines whether there is more unprocessed encoded data on the storage medium 64. If it is determined that there is such data on the storage medium 64, the process returns to step S23 to repeat the process from step S23.

In the case where it is determined in step S27 that there is no more unprocessed encoded data stored on the storage medium 64, the playback process is ended.

Figure 18:
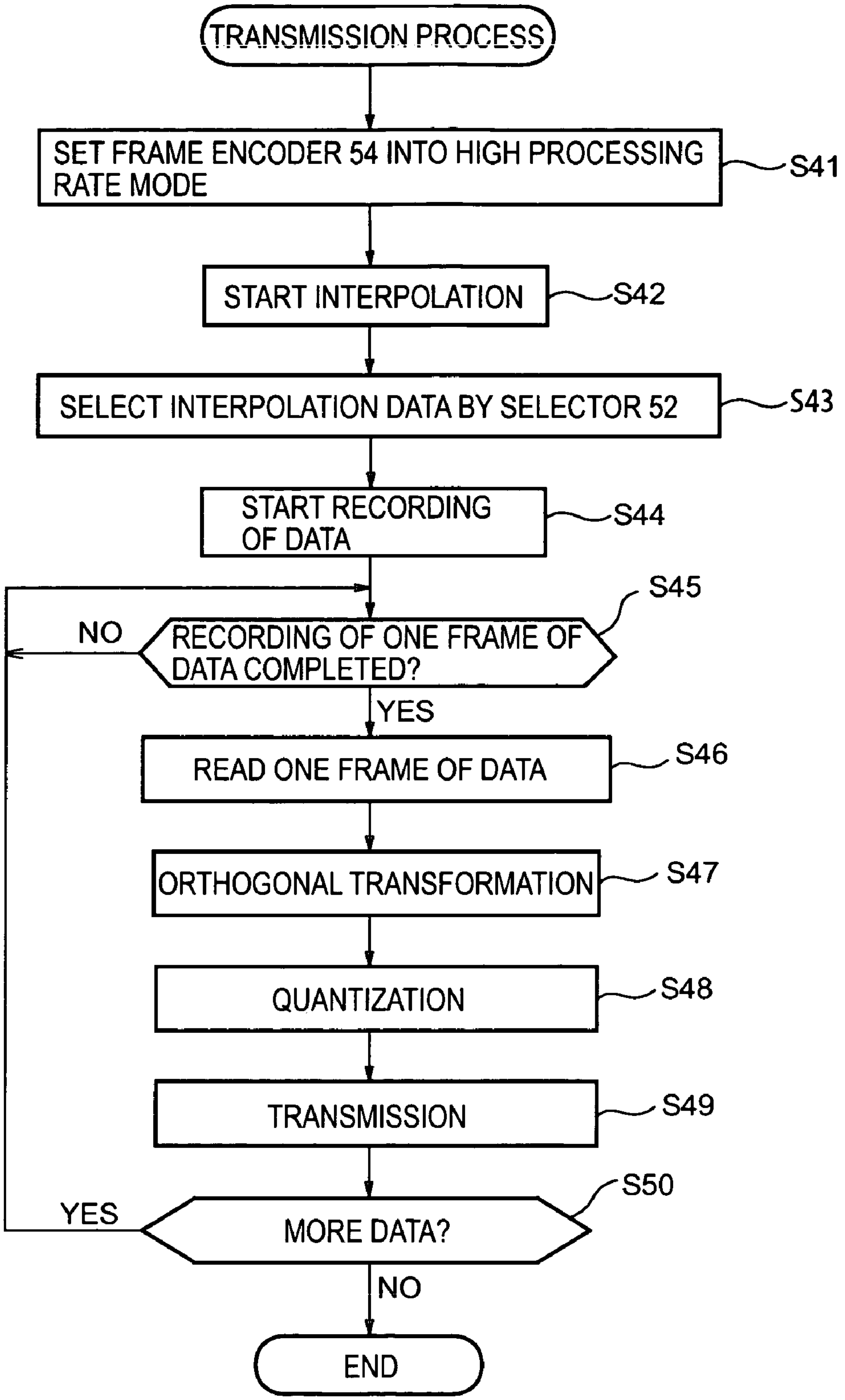
FIG. 18 is a flowchart showing a transmitting process.

Now, referring to a flow chart shown in FIG. 18, a transmission process of transmitting audio data via the transmission medium 65 is described.

The transmission process is started, for example, when audio data in the form of PCM data to be transmitted is supplied to the codec system.

First, in step S41 in the transmission process, the controller 63 controls the frame encoder 54 so as to operate in the high rate mode. That is, in step S41, the operation mode of the frame encoder 54 is set to the high rate mode, and the frame encoder 54 starts the process at the predetermined high rate.

After the process in step S41 is completed, the process proceeds to step S42. In step S4, the controller 63 controls the interpolator 51 to start an interpolation process on original PCM data supplied to the codec system. That is, the interpolator 51 starts outputting of oversampled data including as many samples as R times greater than the number of samples included in the original PCM data. The process then proceeds to step S43.

In step S43, the controller 63 controls the selector 52 such that, of original PCM data and oversampled data output from the interpolator 51, the oversampled data is selected. As a result, the oversampled data output from the interpolator 51 is supplied from the selector 52 to the signal storage unit 53.

Thereafter, the process proceeds from step S43 to step S44. In step S44, the signal storage unit 53 starts storing the oversampled data supplied from the selector 52. The process then proceeds to step S45.

In step S45, the frame encoder 54 determines whether one frame of oversampled data has been stored in the signal storage unit 53. If it is determined that data has not yet been stored, the process returns to step S45. On the other hand, if it is determined in step S45 that one frame of oversampled data has been stored in the signal storage unit 53, the process proceeds to step S46. In step S46, the orthogonal transformer 91 of the frame encoder 54 (FIG. 9) reads one frame of oversampled data from the signal storage unit 53. The process then proceeds to step S47.

In step S47, the orthogonal transformer 91 performs an orthogonal transformation on the one frame of oversampled data read, in the immediately previous step S46, from the signal storage unit 53, and the orthogonal transformer 91 supplies the resultant orthogonally transformed data to the quantizer/encoder 92. The process then proceeds to step S48. In step S48, the quantizer/encoder 92 quantizes the orthogonally transformed data supplied from the orthogonal transformer 91, thereby producing encoded data. The process then proceeds to step S49.

Note that the operation mode of the frame encoder 54 has been set, in step S41, to the high rate mode, and thus step S47 performed by the orthogonal transformer 91 and step S48 performed by the quantizer/encoder 92 are processed at a rate R times higher than the normal rate.

The value of R indicating the relative processing rate (hereinafter, referred to simply as relative processing rate R) may be fixed for both the encoder 61 and the decoder 62 or may be variable. When the relative processing rate R is variable, the variable value of the relative processing rate R is determined by the controller 63, for example, depending on the data transmission delay in the transmission medium 65 and/or other factors, or may be determined according to a command input by a user via the input unit 37 (FIG. 3). However, when the value of the relative processing rate R is variable in transmission of audio data from the information processing apparatus 21 to 22 (or from the information processing apparatus 22 to 21), the controller 63 of the information processing apparatus 22 at a receiving end has to know the relative processing rate R and the decimation rate set by the controller 63 of the information processing apparatus 21 at a transmitting end. Therefore, when the relative processing rate R is variable, the relative processing rate R and the decimation rate set by the controller 63 of the information processing apparatus 21 at a transmitting end side may be transmitted together with the encoded data.

In step S49, the frame encoder 54 transmits the encoded data over the transmission medium 65. The process then proceeds to step S50. In step S50, the frame encoder 54 determines whether there is more unprocessed oversampled data in the signal storage unit 53. If it is determined that there is such data in the signal storage unit 53, the process returns to step S45 to repeat the process from step S45.

In the case where it is determined in step S50 that there is no more unprocessed oversampled data stored in the signal storage unit 53, the transmission process is ended.

As described above, the frame encoder 54 processes the oversampled data including as many samples as R times greater than the number of samples included in the original PCM data, it is theoretically possible to reduce the algorithm delay to 1/R of the algorithm delay which occurs when the original PCM data is directly processed.

Figure 19:
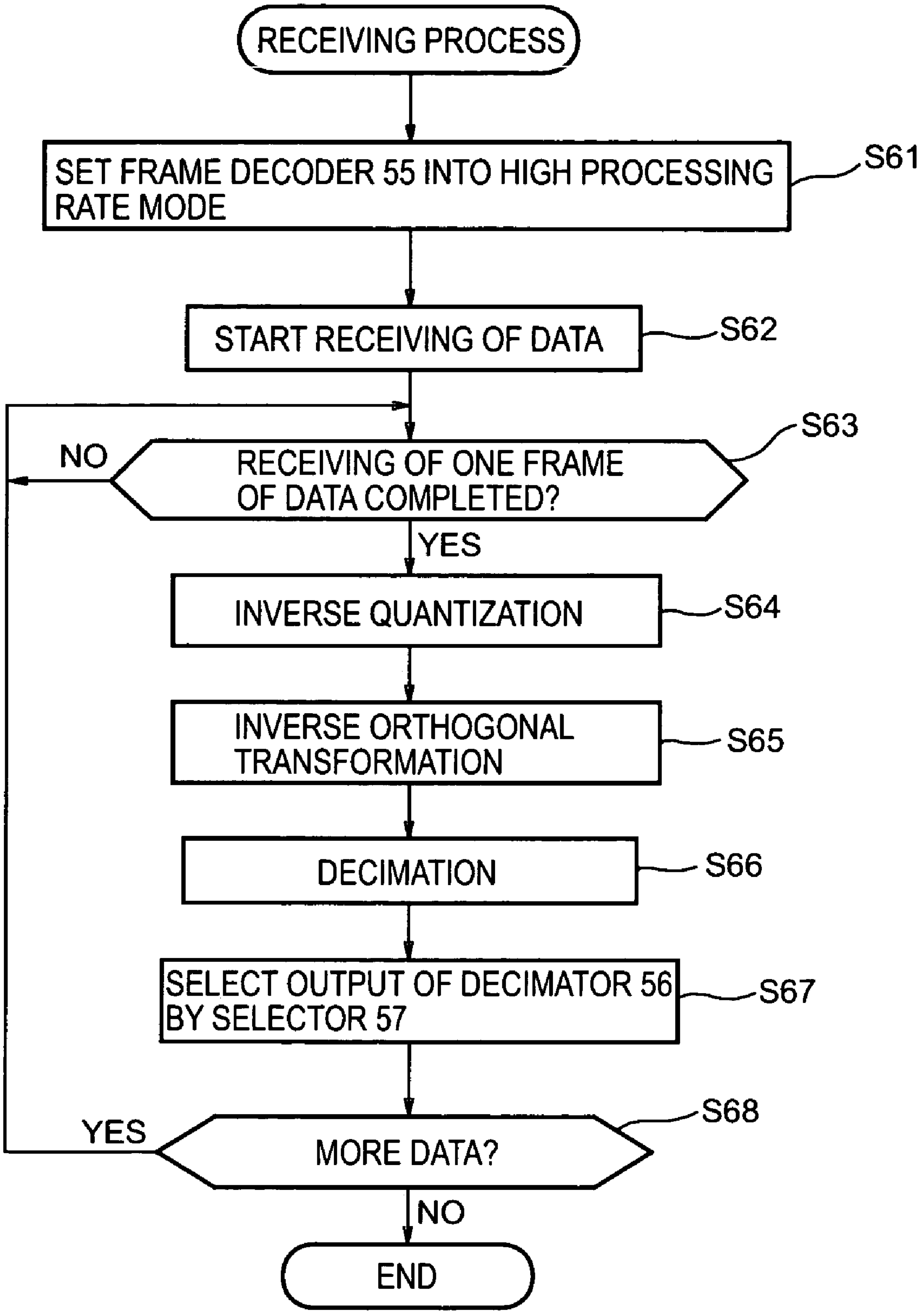
FIG. 19 is a flowchart showing a receiving process.

Now, referring to a flow chart shown in FIG. 19, a receiving process of receiving audio data transmitted via the transmission medium 65 is described.

The receiving process is started, for example, when audio data in the form of PCM data transmitted via the transmission medium 65 is supplied to the codec system.

First, in step S61 in the receiving process, the controller 63 controls the frame decoder 55 so as to operate in the high rate mode. That is, in step S61, the operation mode of the frame decoder 55 is set to the high rate mode, and the frame decoder 55 starts the process at a rate R times higher than the normal rate.

After the process in step S61 is completed, the process proceeds to step S62. In step S62, the frame decoder 55 starts receiving the encoded data transmitted via the transmission medium 65. The process then proceeds to step S63.

In step S63, the frame decoder 55 determines whether one frame of encoded data has been received. If it is determined that data has not yet been received, the process returns to step S63. On the other hand, if it is determined in step S63 that one frame of encoded data has been received, the process proceeds to step S64. In step S64, the decoder/inverse quantizer 101 of the frame decoder 55 (FIG. 15) performs an inverse quantization process on the one frame of encoded data thereby decoding it into orthogonally transformed data. The resultant data is supplied to the inverse orthogonal transformer 102. The process then proceeds to step S65. In step S65, the inverse orthogonal transformer 102 performs an inverse orthogonal transformation on the orthogonally transformed data supplied from the decoder/inverse quantizer 101, and the inverse orthogonal transformer 102 supplies the resultant PCM data as output data to the decimator 56 and the selector 57. Thereafter, the process proceeds to step S66. In step S66, the controller 63 controls the decimator 56 to perform a decimation process. The decimator 56 decimates the output data supplied from the Inverse orthogonal transformer 102 of the frame decoder 55 so as to reduce the number of samples to 1/R. More specifically, after the decimator 56 selects a first sample of the output data, the decimator 56 does not select following R−1 samples. After the decimator 56 rejects R−1 samples, the decimator 56 selects a next sample. The decimated PCM data obtained by performing the above process repeatedly is output to the selector 57.

Thereafter, the process proceeds from step S66 to step S67. In step S67, the controller 63 controls the selector 57 such that, of the data output from the frame decoder 55 and data output from the decimator 56, the data output from the decimator 56 is selected by the selector 57.

Thus, the selector 57 selects the decimated PCM data supplied from the decimator 56 and outputs the selected data. The decimated audio data output from the selector 57 is supplied, for example, to the output unit 36 (FIG. 3) and is output to the outside.

Note that the operation mode of the frame decoder 55 has been set, in step S61, to the high rate mode, and thus step S64 performed by the decoder/inverse quantizer 101 and step S65 performed by the inverse orthogonal transformer 102 are processed at the rate R times higher than the normal rate.

After the process in step S67 is completed, the process proceeds to step S68. In step S68, the frame decoder 55 determines whether more encoded data will be transmitted via the transmission medium 65. If it is determined that more encoded data will be transmitted, the process returns to step S63 to repeat the process from step S63.

In the case where it is determined in step S68 that no more encoded will be transmitted, the receiving process is ended.

As described above, the frame decoder 55 processes the encoded data obtained from the oversampled data including as many samples as R times greater than the number of samples included in the original PCM data at the rate R times higher than the normal rate, and then data obtained as a result of the process is decimated such that the number of samples is reduced to 1/R. Thus, theoretically, it is possible to reduce the algorithm delay to 1/R of the algorithm delay which occurs when the original PCM data is directly processed.

In the transmission process and also in the receiving process, because the frame encoder 54 or the frame decoder 55 processes the oversampled data including as many samples as R times greater than the number of samples included in the original PCM data at the rate R times higher than the normal rate, the amount of processing performed by the frame encoder 54 or the frame decoder 55 becomes R times greater than the amount of processing needed to process the original PCM data at the normal rate. However, in practice, as described earlier, in the processing of the oversampled data the number of samples of which has been increased to R times the number of samples of the original PCM data, it is needed to perform the process only for spectral components in the range of angular frequency from 0 to $\pi/(2R)$ (shaded in FIG. 20), and it is not needed to perform the process for all spectral components of the oversampled data shown in FIG. 20. Therefore, the actual amount of processing is much lower than R times the amount of processing needed to process the original PCM data.

Figure 20:
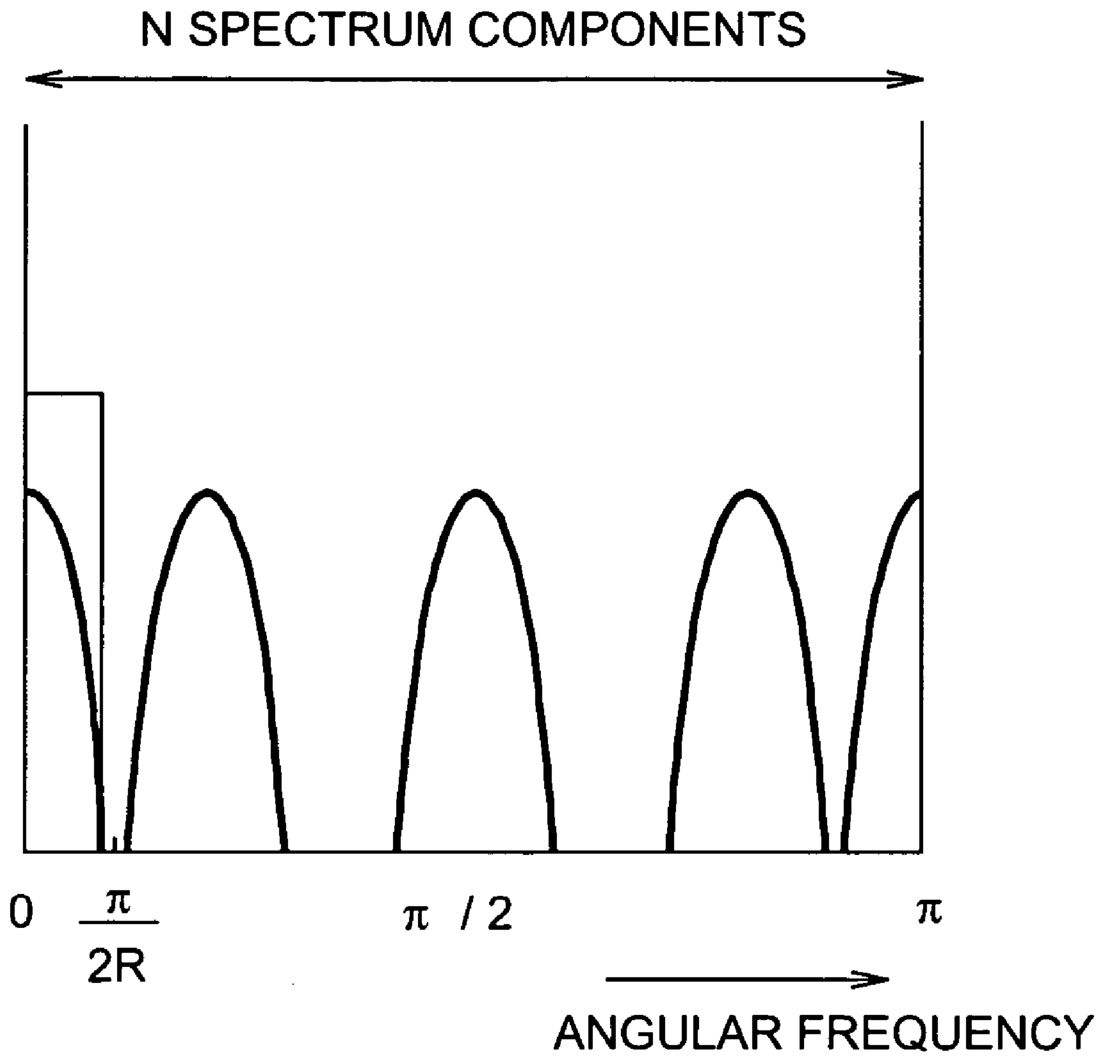
FIG. 20 is diagram showing a spectrum of PCM data oversampled in a 0-filling mode.

Note that FIG. 20 shows a spectrum of oversampled data obtained by performing R-times 0-filling oversampling on original PCM data, as with the spectrum shown in FIG. 12.

Figure 21:
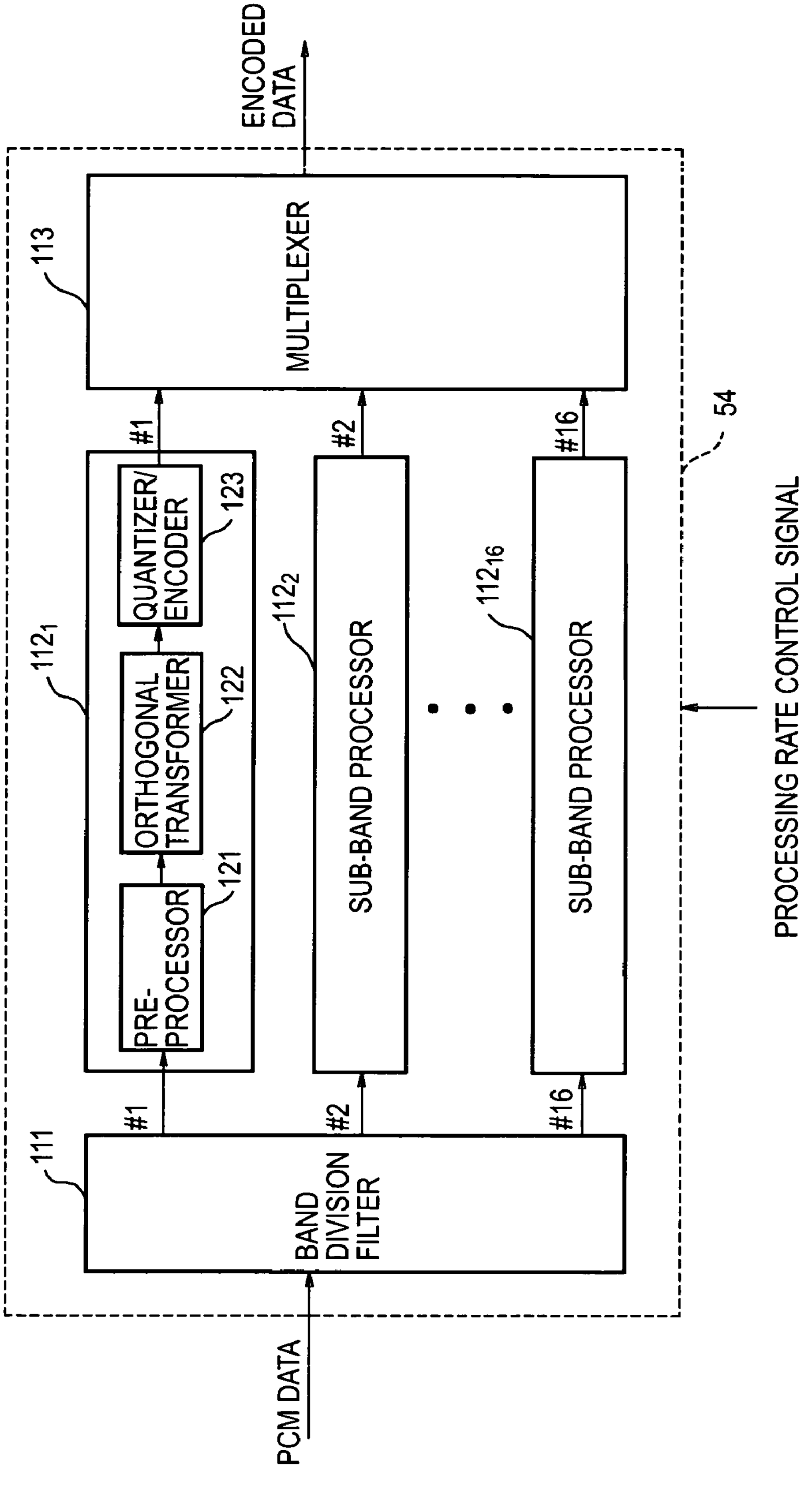
FIG. 21 is a block diagram showing another example of a construction of a frame encoder 54.

FIG. 21 shows an example of the construction of the frame encoder 54 adapted to divide PCM data into a plurality of subband data by performing a frequency band division process on the PCM data, and further perform at least an orthogonal transformation thereby encoding the PCM data.

An example of the method to encode PCM data by first performing the frequency band division process and then, at least, the orthogonal transformation is ATRAC (Adaptive TRansform Acoustic Coding) (including versions of ATRAC, ATRAC3, and ATRAC-X). In the following discussion, it is assumed that the frame encoder 54 encodes PCM data using the ATRAC-X method. In the ATRAC-X method, one frame includes 2048 samples, and PCM data is divided into 16 subbands as a result of the frequency band division.

As shown in FIG. 21, the frame encoder 54 includes a band division filter 111, 16 subband processors $\mathbf{112}_1$ to $\mathbf{112}_{16}$, and a multiplexer 113.

As for the band division filters 111, for example, a PQF (Polyphase Quadrature Filter) is used. The PCM data input to the band division filter 111 is divided into 16 subbands, and the resultant subband data are supplied to corresponding subband processors $\mathbf{112}_1$ to $\mathbf{112}_{16}$. Hereinafter, 16 subbands will be respectively denoted as a subband #1, a subband #2, . . . , a subband #16 in the order of increasing frequency. Furthermore, data of respective subbands #1, #2, . . . , #16 will be denoted as subband data #1, subband data #2, . . . , subband data #16. Subband data #i (i=1, 2 , . . . , 16) is supplied from the band division filter 111 is supplied to a subband processor $\mathbf{112}_i$ and is processed thereby.

The subband processor $\mathbf{112}_i$ processes the subband data #i supplied from the band division filter 111, and supplies resultant encoded data of the subband-#i to the multiplexer 113.

The subband processor $\mathbf{112}_1$ includes-a pre-processor 121, and orthogonal transformer 122, and a quantizer/encoder 123. The pre-processor 121 performs a gain adjustment of the subband data #1 supplied to the subband processor $\mathbf{112}_1$ and supplies the resultant subband data #1 to the orthogonal transformer 122. The orthogonal transformer 122 performs an MDCT process on the subband data #1 received from the pre-processor 121, and supplies MDCT coefficients obtained as a result of the MDCT process to the quantizer/encoder 123. The quantizer/encoder 123 quantizes the MDCT coefficients supplied from the orthogonal transformer 122 thereby producing encoded data of the subband #1, and the quantizer/encoder 123 supplies the resultant encoded data of the subband #1 to the multiplexer 113.

The subband processors $\mathbf{112}_i$ other than the subband processor $\mathbf{112}_1$ are similar in structure to the subband processor $\mathbf{112}_1$, and each subband processor $\mathbf{112}_1$ processes subband data #i supplied from the band division filter 111 in a similar manner to the subband processor $\mathbf{112}_1$, and supplies the resultant encoded data of the subband #i to the multiplexer 113.

The multiplexer 113 multiplexes the encoded data of the subbands #1 to #16 supplied from the subband processors $\mathbf{112}_1$ to $\mathbf{112}_{16}$, and outputs the resultant multiplexed data as final encoded data.

In the ATRAC-X method, the MDCT process, which is an orthogonal transformation process, is performed over two frames each including 2048 samples such that one of two frames is the same as one of two frames that have been processed in a previous operation. Because the MDCT process is performed over two frames, the band division filter 111 divides two frames of PCM data (including 4096 samples) into subband data of 16 subbands and supplies the respective subband data to corresponding subband processors $\mathbf{112}_i$ responsible for the MDCT process for respective subbands. Therefore, subband data of each subband includes 256 samples (=4096 samples//16).

When the frame encoder 54 shown in FIG. 21 processes oversampled data produced by performing R-times oversampling on original PCM data, it is needed to process only spectral components thereof in the range of angular frequency from 0 to π/(2R), as described earlier with reference to FIGS. 10 to 14.

Therefore, of subband data #1 to #16 of 16 subbands output from the band division filter 111, subband data of subbands in the range of angular frequency equal to or higher than π/(2R) do not need to be processed, that is, subband processors $\mathbf{112}_i$ responsible for processing such subband data do not need to perform the process.

More specifically, when R=2, only the subband processors $\mathbf{112}_1$ to $\mathbf{112}_8$ responsible for processing subband data #1 to #8 need to perform the process, but the subband processors $\mathbf{112}_9$ to $\mathbf{112}_{16}$ responsible for processing subband data #9 to #16 do not need to perform the process.

In this case, the multiplexer 113 multiplexes encoded data by regarding all encoded data of subbands #9 to #16 supplied from the subband processors $\mathbf{112}_9$ to $\mathbf{112}_{16}$ as 0.

Also in the frame encoder 54 shown in FIG. 21, when oversampled data is processed under the control of the controller 63, the process is performed at a rate R times higher than the rate at which original PCM data is directly processed.

However, when R=2, as described above, the subband processors $\mathbf{112}_9$, to $\mathbf{112}_{16}$ responsible for processing subband data #9 to #16 do not need to perform the process, and the band division filter 111 also do not need to perform the band division process for producing subband data #9 to #16 from the oversampled data.

Therefore, when the frame encoder 54 performs the process for oversampled data, although the process is performed at a rate R times higher than the rate at which original PCM data is directly processed, the amount of processing performed by the band division filter 111 and the subband processors $\mathbf{112}_1$ to $\mathbf{112}_{16}$ to deal with one frame of oversampled data is 1/R of the amount of processing needed to process one frame of original PCM data.

If the amount of processing performed by the frame encoder 54 shown in FIG. 21 to deal with one frame of original PCM is represented as 1, and the amount of processing performed by the multiplexer 113 is denoted by r, the amount of process performed by the band division filter 111 and the subband processors $\mathbf{112}_1$ to $\mathbf{112}_{16}$ to deal with one frame of original PCM data is given by 1−r.

When the frame encoder 54 performs the process for oversampled data, the amount of processing performed by the band division filter 111 and the subband processors $\mathbf{112}_1$ to $\mathbf{112}_{16}$ to deal with one frame of oversampled data is, as describe above, 1/R of the amount of processing needed to process one frame of original PCM data, that is, (1−r)/R.

Therefore, in the frame encoder 54, the amount of processing needed to deal with one frame of oversampled data is given by the sum of the amount of processing performed by the band division filter 111 and the subband processors $\mathbf{112}_1$ to $\mathbf{112}_{16}$ ((1=r)/R) and the amount of processing performed by the multiplexer 113 (r), that is, the sum of (1−r)/R) and r. Thus, the total amount of process is given by (1−1/R)r+1/R(=(1−r)/R+r). When the frame encoder 54 processes oversampled PCM data, because the process is performed at a rate R times higher than the rate at which original PCM data is directly processed, the amount of processing needed to oversampled data in the same time as the time needed to process one frame of original PCM data is given by R times the amount of processing needed to deal with one frame of oversampled data, that is, given by R×(1−1/R)r+1/R=1+(R−1)r.

If the multiplexer 113 does not multiplex encoded data with a value of 0 of subband data in the range of angular frequency equal to or higher than π/(2R), that is, if the multiplexer 113 does not process subband data in the range of angular frequency equal to or higher than π/(2R) as with the band division filter 111 and the subband processor $\mathbf{112}_1$ to $\mathbf{112}_{16}$, then, theoretically, there is no difference between the amount of processing performed by the frame encoder 54 to deal with oversampled data and that performed to deal with original PCM data.

Figure 22:
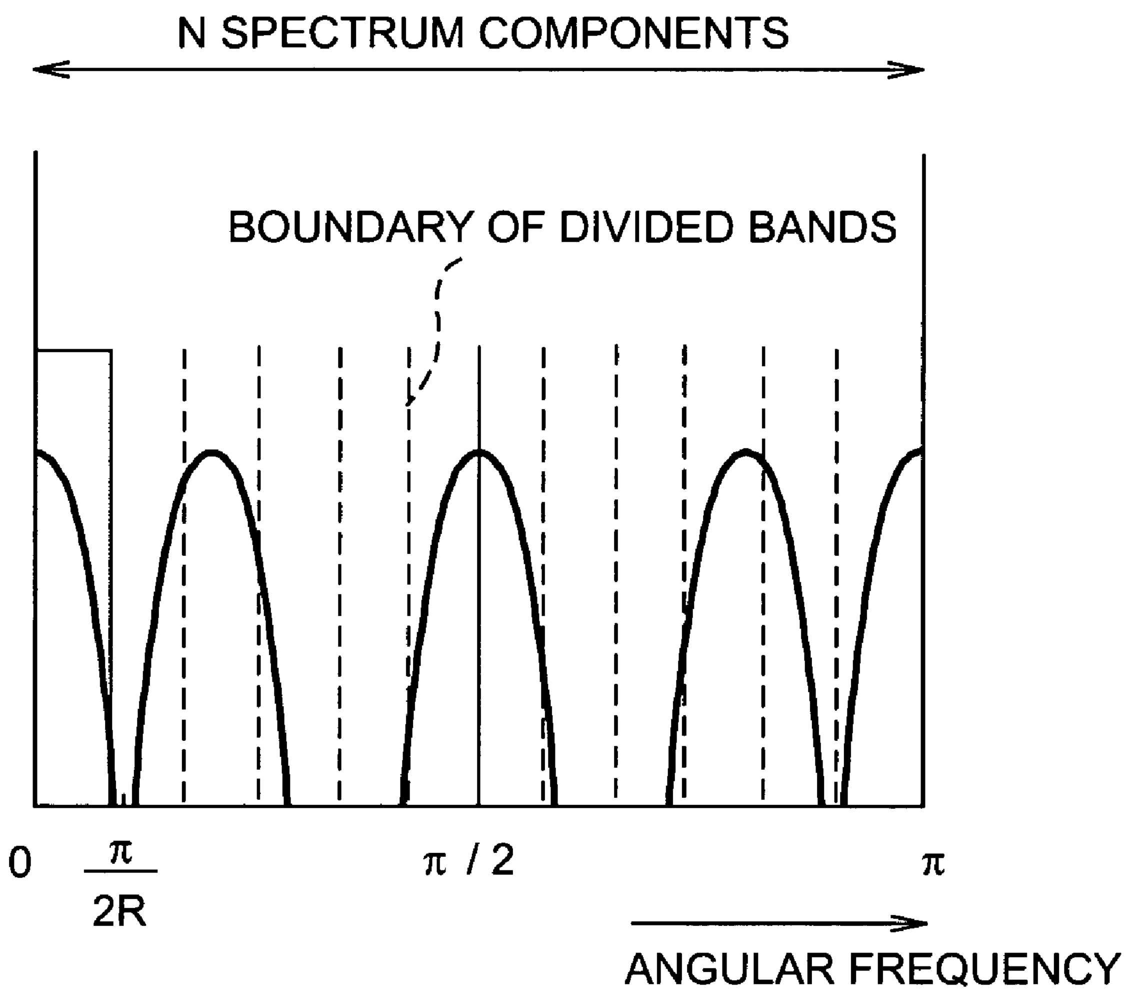
FIG. 22 is diagram showing a spectrum of PCM data oversampled in a 0-filling mode.

As described above, when the frame encoder 54 divides PCM data into subband data of respective frequency bands and processes resultant subband data, it is not needed to process components (subband data) at angular frequencies equal to or higher than π/(2R) of oversampled data shown in FIG. 22, and thus it is possible to suppress the increase in the total amount of processing even when the process is performed at a rate R times higher than the normal rate.

In the above process, the controller 63 controls the frame encoder 54 such that, components (subband data) with angular frequencies equal to or higher than π/(2R) of the oversampled data are not processed (that is, only components (subband data) with angular frequencies lower than π/(2R) of the oversampled data are processed).

In the example shown FIG. 22, the subband #1 is a frequency band (shaded in FIG. 22) corresponding to the range of angular frequency from 0 to π/(2R), and thus, for oversampled data having a spectrum similar to that shown in FIG. 22, it is needed to perform only the subband data #1. Note that FIG. 22 shows a spectrum of oversampled data obtained by performing R-times 0-filling oversampling on original PCM data, as with the spectrum shown in FIG. 12.

Figure 23:
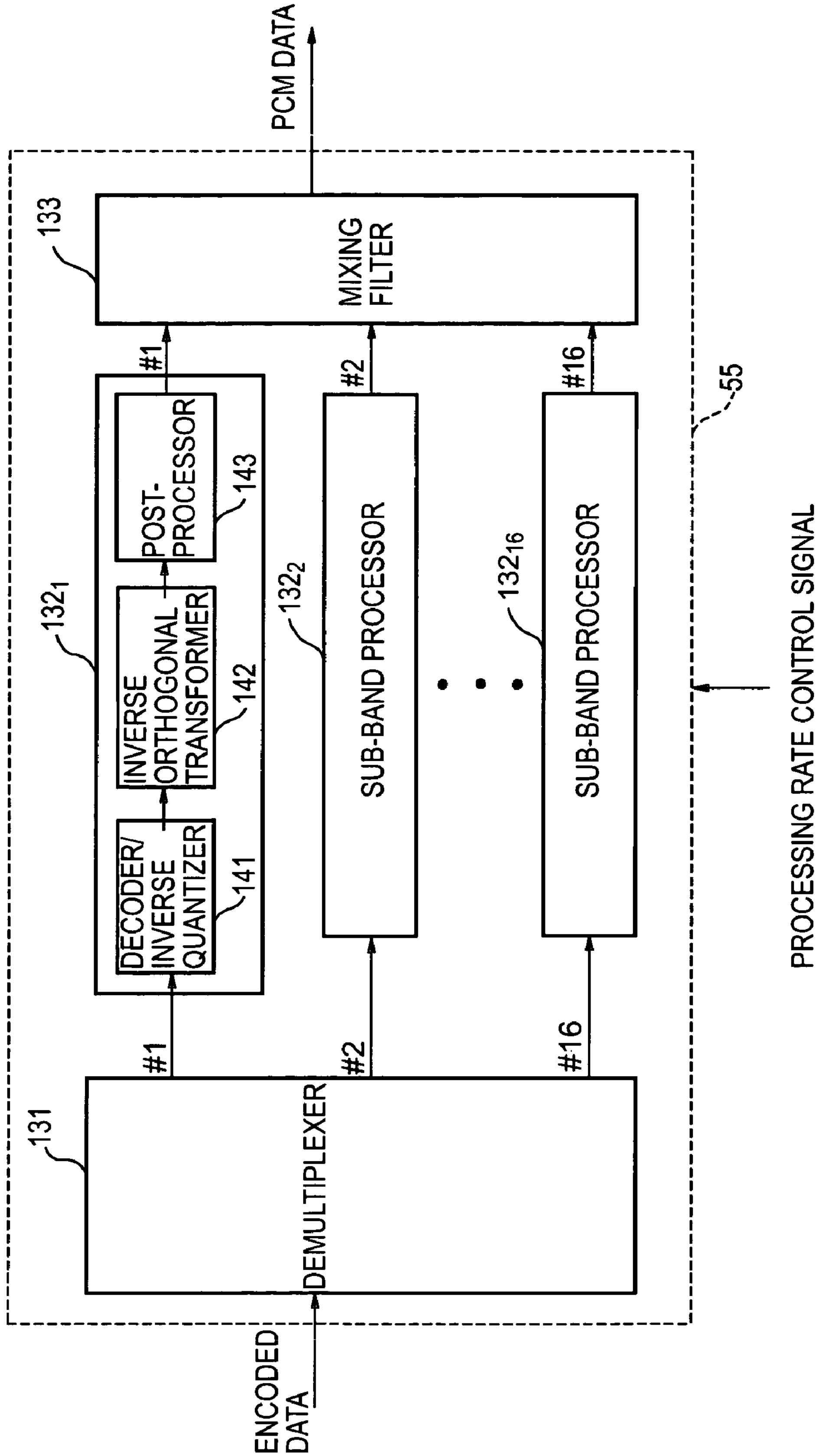
FIG. 23 is a block diagram showing another example of a construction of a frame decoder 55.

FIG. 23 shows an example of a construction of the frame decoder 55 adapted to decode data encoded by the frame encoder 54 configured as shown in FIG. 21.

Encoded data supplied to the frame decoder 55 is applied to a demultiplexer 131. The demultiplexer 131 demultiplexes the encoded data supplies thereto into 16 subbands #1 to #16 and supplies resultant encoded data of the subbands #i to respective subband processors $\mathbf{132}_i$.

Each subband processor $\mathbf{132}_i$ processes the subband data #i supplied from the demultiplexer 131 to obtain subband data of the subband #i, and supplies the resultant subband data to a mixing filter 133.

In the ATRAC-X method, because subband data of each subband includes 256 samples as described earlier, each subband processor $\mathbf{132}_i$ outputs subband data #i including 256 samples per frame to the mixing filter 133.

The subband processor $\mathbf{132}_1$ includes a decoder/inverse quantizer 141, an inverse orthogonal transformer 142, and a post-processor 143. The decoder/inverse quantizer 141 performs inverse quantization on the subband data #1 supplied from the demultiplexer 131 thereby decoding it into MDCT coefficients of the subband #1, and supplies the resultant MDCT coefficients to the inverse orthogonal transformer 142. The inverse orthogonal transformer 142 performs an inverse MDCT process on the MDCT coefficients of the subband #1 received from the decoder/inverse quantizer 141, and supplies a subband data #1 obtained as a result of the inverse MDCT process to the post-processor 143. The post-processor 143 performs post-processing on the subband data #1 supplied from the inverse orthogonal transformer 142, and supplies resultant subband data #1 to the mixing filter 133.

The subband processors $\mathbf{132}_i$ other than the subband processor $\mathbf{132}_1$ are similar in structure to the subband processor $\mathbf{132}_1$, and each subband processor $\mathbf{132}_1$ processes encoded data of the subband #i supplied from the demultiplexer 131 in a similar manner to the subband processor $\mathbf{132}_1$, and supplies a subband data #i obtained as a result to the mixing filter 133.

The mixing filter 133 mixes subband data #i supplied as 16 frequency band components from the respective subband processors $\mathbf{132}_1$ $\mathbf{132}_{16}$, and outputs obtained PCM data as mixed data.

Also in the frame decoder 55 shown in FIG. 23, as in the frame encoder 54 shown in FIG. 21, when the frame decoder 55 processes oversampled data produced by performing R-times oversampling, it is needed to process only spectral components thereof in the range of angular frequency from 0 to π/(2R), as described earlier with reference to FIGS. 10 to 14.

Therefore, of encoded data of 16 subbands #1 to #16 output from the demultiplexer 131, encoded data of subbands in the range of angular frequency equal to or higher than π/(2R) do not need to be processed, that is, subband processors $\mathbf{132}_i$ responsible for processing such encoded data of subbands do not need to perform the process.

More specifically, when R=2, only the subband processors $\mathbf{132}_1$ to $\mathbf{132}_8$ responsible for processing encoded data of subbands #1 to #8 need to perform the process, but the subband processors $\mathbf{132}_9$ to $\mathbf{132}_{16}$ responsible for processing encoded data of subbands #9 to #16 do not need to perform the process.

In this case, the mixing filter 133 mixes subband data by employing 0 as the value for all subband data of subbands #9 to #16 supplied from the subband processors $\mathbf{132}_9$ to $\mathbf{132}_{16}$.

When the frame decoder 55 shown in FIG. 23 processes, under the control of the controller 63, encoded data obtained from oversampled data, the process is performed at a rate R times higher than the rate at which encoded data obtained from original PCM data is processed.

However, when the frame decoder 55 shown in FIG. 23 performs process at the rate R times higher than the normal rate, as with the frame encoder 54 shown in FIG. 21, it is not needed to process components with angular frequencies equal to or higher than π/(2R) of the encoded data of the subbands #1 to #16. Therefore, processing at the high rate R times higher than the normal rate can be performed without causing a significant increase in the total amount of processing.

In the above process, the controller 63 controls the frame decoder 55 such that components with angular frequencies equal to or higher than π/(2R) of the encoded data of the subbands #1 to #16 are not processed (that is, only components with angular frequencies lower than π/(2R) of the encoded data of the subbands #1 to #16 are processed).

In the encoder 61, as described above, input PCM data is subjected to R-times oversampling, and the resultant oversampled data is processed by the frame encoder 54 at the rate R times higher than the normal rate. On the other hand, in the decoder 62, encoded data received from the encoder 61 is processed at the rate R times higher than the normal rate, and PCM data (output data) obtained as a result of the processing is decimated so as to reduce the data size into 1/R. Thus, a reduction in the algorithm delay can be achieved without causing a significant increase in the amount of processing. This makes it possible for users to communicate each other smoothly in an IP telephone system or the like in which real-time two-way communication is needed.

In the codec system, the reduction in the algorithm delay can be achieved without having to change the frame length, that is, the number of samples included in one frame, in the orthogonal transformation process (and also in the inverse orthogonal transformation process). This makes it possible to realize the codec system at low cost based on the conventional codec system.

For example, in the ATRAC-X system, the sampling frequency Fs is set to be 32 (kHz), and each frame includes 2048 samples. Therefore, when R=1, that is, in the conventional ATRAC-X coding system, an algorithm delay of 64 (m sec) (=2048 samples/32 (kHz)) occurs.

In contrast, when R=2, the algorithm delay is reduced 32 (m sec), which is ½ of the algorithm delay that occurs in the conventional ATRAC-X codec system. When R=4, the algorithm delay is further reduced 16 (m sec), which is ¼ of the algorithm delay that occurs in the conventional ATRAC-X codec system.

In the encoder 61 and also in the decoder 62, in addition to the algorithm delay that occurs in the process of forming a frame to be subjected to the orthogonal transformation process (or the inverse orthogonal transformation process), delays due to other factors also occur. For example, in the IP telephone system, a delay greater than 50 (m sec) occurs in transmission via the Internet used as the transmission medium 65. Therefore, to achieve smooth communication in the IP telephone system having such a transmission delay, it is desirable that an additional delay caused by the algorithm delay in the process of forming a frame be less than 50 (m sec). This can be achieved by setting R to 2 or 4.

Note that in the encoder 61 (also in the decoder 62), an increase in the processing rate by a factor of R by simply increasing the system clock by a factor of R does not achieve the effects that can be achieved by processing oversampled data at the rate R times higher than the normal rate in the above-described manner.

For example, in a system in which each frame includes N samples, and processing is performed on a frame-by-frame basis, if the system clock rate is increased by a factor of R, the process for a frame #n is completed in 1/R of the time needed to process the frame #n at the original clock system. However, the process for a next frame #n+1 is not started until the next frame #n+1 is formed. If the clock rate is increased by the factor of R, no change occurs in the interval between the formation of the frame #n and the formation of the next frame #n+1. That is, no change occurs in the interval between the start of the process for the frame #n and the start of the process for the next frame #n+1, if the system clock rate is increased by the factor or R.

On the other hand, in the encoder 61 in which oversampled data produced by performing R-times oversampling on PCM data is processed at the rate higher by the factor of R than the normal processing rate, processing for a frame #n is completed in a time that is 1/R of the time needed to process the frame #n at the normal processing rate, and processing for a next frame #n+1 is started after waiting for formation of the next frame #n+1. However, in this case, because oversampled data forming a frame is produced by performing R-times oversampling on PCM data, the interval between the formation of the frame #n and the formation of the next frame #n+1 is 1/R of the interval needed in the mode in which the process is performed at the normal rate. Therefore, the interval between the start of the frame #n and the start of the next frame #n+1 is 1/R of the interval needed in the mode in which the process is performed at the normal rate.

Herein, let us denote the time needed to process one frame at the normal processing rate as a reference time. In the case in which the processing rate is increased by the factor of R by simply increasing the system clock rate by the factor of R, only one frame is processed in the reference time regardless of whether the processing rate is increased or not. In contrast, in the frame decoder 61, when the processing is performed at the rate greater by the factor of R than the normal processing rate, the number of frames processed in the reference time becomes R times the number of frames processed in the reference time in the mode in which the process is performed at the normal processing rate.

In the encoder 61, the frequency accuracy of oversampled data obtained by performing R-times oversampling on PCM data becomes worse than that obtained when the original PCM data is directly processed without being oversampled, if frequency analysis is performed using the same number of points.

That is, as can be seen by comparison between FIG. 10 and FIG. 12 or 14, the spectrum (FIG. 12 or FIG. 14) of oversampled data obtained by performing g the R-times oversampling on the original PCM data has a distribution shape equivalent to that obtained by compressing the spectrum (FIG. 10) of the original PCM data in the range of angular frequency from 0 to $\pi/2$ into the range from 0 to $\pi/(2R)$, and thus the frequency accuracy becomes 1/R of the original PCM data. The degradation in frequency accuracy results in degradation in sound quality of audio data in the form of PCM data output from the decoder 62.

However, in the encoder 61 (the decoder 62), as described earlier, it is needed to process only data components in the range of angular frequency from 0 to $\pi/(2R)$, it is possible to reduce the degradation in sound quality due to degradation in the frequency accuracy by reducing the quantization step used in the quantization (inverse quantization) process. If the quantization step is reduced, the bit rate of encoded data transmitted from the encoder 61 (and received by the decoder 62) increases, and thus the quantization step is determined taking into account a tradeoff between the bit rate of encoded data and the sound quality.

In the above description of the present invention, it is assumed that audio data is transmitted and received. However, the present invention may also be applied when data other than audio data, such as video data, is transmitted and received.

In the embodiments described above, oversampling is performed by interpolation. However the method of oversampling is not limited to interpolation.

In the embodiments described above, encoding of data is accomplished by performing at least an orthogonal transformation. However, the method of encoding of data is not limited to the orthogonal transformation.

INDUSTRIAL APPLICABILITY

As described above, the present invention allows a reduction in the algorithm delay.

The invention claimed is:

1. A data processing apparatus comprising:

an encoder that encodes input digital data on a frame-by-frame basis and outputs resultant encoded data, each frame of digital data including a predetermined number N of samples, wherein N is one or greater; and a decoder that decodes the encoded data, wherein the encoder comprises oversampling means that, when the oversampling means acquires N/R samples of data, performs R-times oversampling on the acquired N/R samples of data thereby producing N samples of data, wherein R is one or greater;

encoding means for performing encoding on the data on a frame-by-frame basis and outputting resultant encoded data; and encoding control means that controls the encoding means so as to perform the encoding process at a rate R times higher than a rate at which the encoding process is performed if the encoding is performed after waiting for acquiring N samples of data without performing oversampling, and the decoder comprises decoding means for decoding the encoded data; and decimation means that decimates output data that is output from the decoding means and outputs resultant data including resultant samples, the number of resultant samples being 1/R times the number of samples included in the original output data.

2. An encoder that encodes digital data and outputs resultant encoded data, comprising:

oversampling means that performs R-times oversampling on a series of the data, wherein R is a number one or greater;

encoding means that encodes the oversampled data on a frame-by-frame basis and outputs resultant encoded data, each frame of oversampled data including a predetermined number N of samples, wherein N is one or greater; and encoding control means that controls the encoding means so as to perform the encoding process at a rate R times higher than a rate at which the encoding process is performed if the encoding is performed after waiting for acquiring N samples of data without performing oversampling.

3. An encoder according to claim 2, wherein the oversampling means calculates the sample value of a sample to be interpolated and interpolates the sample with the calculated sample value thereby performing the oversampling.

4. An encoder according to claim 2, wherein the oversampling means interpolates a sample with a value of zero without calculating the sample value, thereby performing the oversampling.

5. An encoder according to claim 2, further comprising frequency band division means for dividing the oversampled data into a plurality of subband data, that is, into a plurality of data of frequency bands, wherein the encoding means includes as many subband data processing means as there are frequency bands, for processing subband data of the respective frequency bands; and of the plurality of subband data processing means, only subband data processing means responsible for processing subband data of frequency bands in the range from 0 to π/(2R) in angular frequency perform the encoding processing but the other subband dataprocessing means do not perform the encoding processing.

6. An encoder according to claim 2, wherein the encoding means processes only frequency components of the oversampled data in the range from 0 to π(2R) in angular frequency.

7. An encoding method of encoding digital data and outputting resultant encoded data, comprising the steps of:

performing R-times oversampling on a series of the data, wherein R is a number one or greater;

encoding the oversampled data on a frame-by-frame basis and outputting resultant encoded data, each frame of oversampled data including a predetermined number N of samples. wherein N is one or greater; and controlling the encoding step so as to perform the encoding process at a rate R times higher than a rate at which the encoding process is performed if the encoding is performed after waiting for acquiring N samples of data without performing oversampling.

8. A computer-readable storage medium having a program for causing a computer to perform a process of encoding digital data and outputting resultant encoded data, the process comprising the steps of:

performing R-times oversampling on a series of the data;

encoding the oversampled data on a frame-by-frame basis and outputting resultant encoded data, each frame of oversampled data including a predetermined number N of samples. wherein N is one or greater; and controlling the encoding step so as to perform the encoding process at a rate R times higher than a rate at which the encoding process is performed if the encoding is performed after waiting for acquiring N samples of data without performing oversampling, wherein R is a number one or greater.

9. A decoder that decodes digital encoded data, the encoded data being obtained by performing R-times oversampling on a series of the data, wherein R is a number one or greater, and encoding the oversampled data on a frame-by-frame basis, each frame of oversampled data including a predetermined number N of samples, wherein N is one or greater, the decoder comprising: decoding means for decoding the encoded data;

decimation means that decimates output data that is decoded on a frame-by-frame basis and output by the decoding means and outputs resultant data including samples the number of which is 1/R time the number of samples included in the original output data; and decoding control means that controls the decoding means such that the decoding means performs the process at a rate R times higher than the rate at which the process is performed if the decimation is not performed.

10. A decoder according to claim 9, wherein:

the encoded data is obtained by dividing data obtained by the R-times oversampling into a plurality of subband data, that is, into a plurality of data of frequency bands, and performing the encoding process on the subband data of the respective frequency bands;

the decoding means includes as many subband data processing means as there are frequency bands, for processing subband data of the respective frequency bands; and of the plurality of subband data processing means, only subband data processing means responsible for processing subband data of frequency bands in the range from 0 to π/(2R) in angular frequency perform the decoding processing but the other subband data processing means do not perform the decoding processing.

11. A decoder according to claim 9, wherein the decoding means processes only frequency components of the encoded data in the range from 0 to π/(2R) in angular frequency.

12. A decoding method of decoding digital encoded data, the encoded data being obtained by performing, on a frame-by-frame basis, an encoding process on data obtained by performing R-times oversampling, wherein R is a number one or greater, each frame including a predetermined number of samples, the method comprising the steps of:

decoding the encoded data;

decimating output data that is decoded on a frame-by-frame basis and output in the decoding step and outputting resultant data including samples, the number of samples being 1/R times the number of samples included in the original output data; and controlling the decoding step such that the process is performed at a rate R times higher than the rate at which the process is performed if the decimation is not performed.

13. A comruter-readable storage medium having a program for causing a computer to perform a process of decoding digital encoded data, the process comprising:

the encoded data being obtained by performing, on a frame-by-frame basis, an encoding process on data obtained by performing R-times oversampling on a series of data, wherein R is a number one or greater, each frame including a predetermined number of samples, the process comprising:

decoding the encoded data;

decimating output data that is decoded on a frame-by-frame basis and output in the decoding step and outputting resultant data including samples the number of which is 1/R time the number of samples included in the original output data; and controlling the decoding step such that the process is performed at a rate R times higher than the rate at which the process is performed if the decimation is not performed.

* * * * *